(12) United States Patent
Yoneda et al.

(10) Patent No.: US 11,757,052 B2
(45) Date of Patent: Sep. 12, 2023

(54) SEMICONDUCTOR LIGHT RECEIVING ELEMENT WITH MESA TYPE PHOTODIODE STRUCTURE

(71) Applicant: SUMITOMO ELECTRIC DEVICE INNOVATIONS, INC., Kanagawa (JP)

(72) Inventors: Yoshihiro Yoneda, Yokohama (JP); Koji Ebihara, Yokohama (JP); Takuya Okimoto, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 17/188,335

(22) Filed: Mar. 1, 2021

(65) Prior Publication Data

US 2021/0273121 A1  Sep. 2, 2021

(30) Foreign Application Priority Data

Mar. 2, 2020 (JP) ................................. 2020-035037

(51) Int. Cl.
*H01L 31/0232* (2014.01)
*H01L 31/0304* (2006.01)
(Continued)

(52) U.S. Cl.
CPC .. *H01L 31/02327* (2013.01); *H01L 31/03046* (2013.01); *H01L 31/035281* (2013.01); *H01L 31/109* (2013.01)

(58) Field of Classification Search
CPC ....... H01L 31/02327; H01L 31/035281; H01L 31/109
See application file for complete search history.

(56) References Cited

U.S. PATENT DOCUMENTS 10,910,503 B1    2/2021  Bian et al.
2004/0089876 A1*  5/2004  Kuwatsuka ......... H01L 31/1075
                                                           257/438
(Continued)

FOREIGN PATENT DOCUMENTS

JP      2013-110207    6/2013

OTHER PUBLICATIONS

Notice of Allowance dated Sep. 13, 2022 for U.S. Appl. No. 17/188,393.
Office Action dated Jun. 16, 2022 for U.S. Appl. No. 17/188,393.

*Primary Examiner* — Suberr L Chi
(74) *Attorney, Agent, or Firm* — SMITH, GAMBRELL & RUSSELL, LLP.

(57) ABSTRACT

A semiconductor light receiving element includes a first semiconductor layer, a waveguide type photodiode structure, an optical waveguide structure, and a fourth semiconductor layer. The waveguide type photodiode structure is provided on the first semiconductor layer. The waveguide type photodiode structure includes an optical absorption layer, a second semiconductor layer, a multiplication layer, and a third semiconductor layer. The optical waveguide structure is provided on the first semiconductor layer. The optical waveguide structure includes an optical waveguiding core layer and a cladding layer. An end face of the waveguide type photodiode structure faces to an end face of the optical waveguide structure. The fourth semiconductor layer is located between the end face of the waveguide type photodiode structure and the end face of the optical waveguide structure. The fourth semiconductor layer contacts the multiplication layer at the end face of the waveguide type photodiode structure.

19 Claims, 13 Drawing Sheets

(51) Int. Cl.
H01L 31/0352 (2006.01)
H01L 31/109 (2006.01)

(56) References Cited

U.S. PATENT DOCUMENTS

| | | | |
|---|---|---|---|
| 2007/0051939 A1* | 3/2007 | Nakahara | B82Y 20/00 |
| | | | 257/14 |
| 2009/0321868 A1* | 12/2009 | Nakaji | H01L 31/105 |
| | | | 257/458 |
| 2020/0185561 A1 | 6/2020 | Huang et al. | |
| 2021/0273122 A1* | 9/2021 | Yoneda | H01L 31/02327 |

* cited by examiner

SEMICONDUCTOR LIGHT RECEIVING ELEMENT WITH MESA TYPE PHOTODIODE STRUCTURE

CROSS-REFERENCE TO RELATED APPLICATIONS

The present application is based upon and claims the benefit of the priority from Japanese Patent Application No. 2020-035037, filed on Mar. 2, 2020, the entire contents of which are incorporated herein by reference.

TECHNICAL FIELD

The present disclosure relates to a semiconductor light receiving element.

BACKGROUND

JP2013-110207A discloses a technology related to a semiconductor optical integrated element and a method of manufacturing the same. The semiconductor optical integrated element includes a photodiode region formed on a semiconductor substrate, and an optical waveguide region subjected to butt joint coupling to an end face of the photodiode region. The photodiode region includes an optical absorption layer and a p-type cladding layer laminated in this order on an n-type cladding layer. The optical waveguide region includes an optical waveguiding layer and an upper cladding layer laminated in this order on the n-type cladding layer. The optical waveguiding layer has an ascending portion with respect to the inclined butt joint end face.

SUMMARY

The present disclosure provides a semiconductor light receiving element. The semiconductor light receiving element includes a first semiconductor layer, a waveguide type photodiode structure, an optical waveguide structure, and a fourth semiconductor layer. The first semiconductor layer is of a first conductive type. The waveguide type photodiode structure has an end face provided on the first semiconductor layer. The waveguide type photodiode structure includes an optical absorption layer, a second semiconductor layer, a multiplication layer, and a third semiconductor layer. The optical absorption layer is of an intrinsic conductive type or a first conductive type. The second semiconductor layer is of a first conductive type. The multiplication layer is of an intrinsic conductive type or a first conductive type. The third semiconductor layer is of a second conductive type. The optical waveguide structure has an end face provided on the first semiconductor layer. The optical waveguide structure includes an optical waveguiding core layer and a cladding layer. The end face of the waveguide type photodiode structure faces to the end face of the optical waveguide structure. The fourth semiconductor layer is of a second conductive type. The fourth semiconductor layer is located between the end face of the waveguide type photodiode structure and the end face of the optical waveguide structure. The fourth semiconductor layer is contacted with the multiplication layer of the end face of the waveguide type photodiode structure.

The present disclosure provides a semiconductor light receiving element. The semiconductor light receiving element includes a first semiconductor layer, a photodiode structure, and a seventh semiconductor layer. The first semiconductor layer is of a first conductive type. The photodiode structure is provided on the first semiconductor layer. The photodiode structure has an end face. The photodiode structure includes an optical absorption layer, a second semiconductor layer, a multiplication layer, and a third semiconductor layer. The optical absorption layer, is of an intrinsic conductive type or a first conductive type. The second semiconductor layer is of a first conductive type. The multiplication layer is of an intrinsic conductive type or a first conductive type. The third semiconductor layer is of a second conductive type. The seventh semiconductor layer is of a second conductive type. The seventh semiconductor layer is contacted with the multiplication layer on the end face of the photodiode structure.

DETAILED DESCRIPTION

Figure 1:
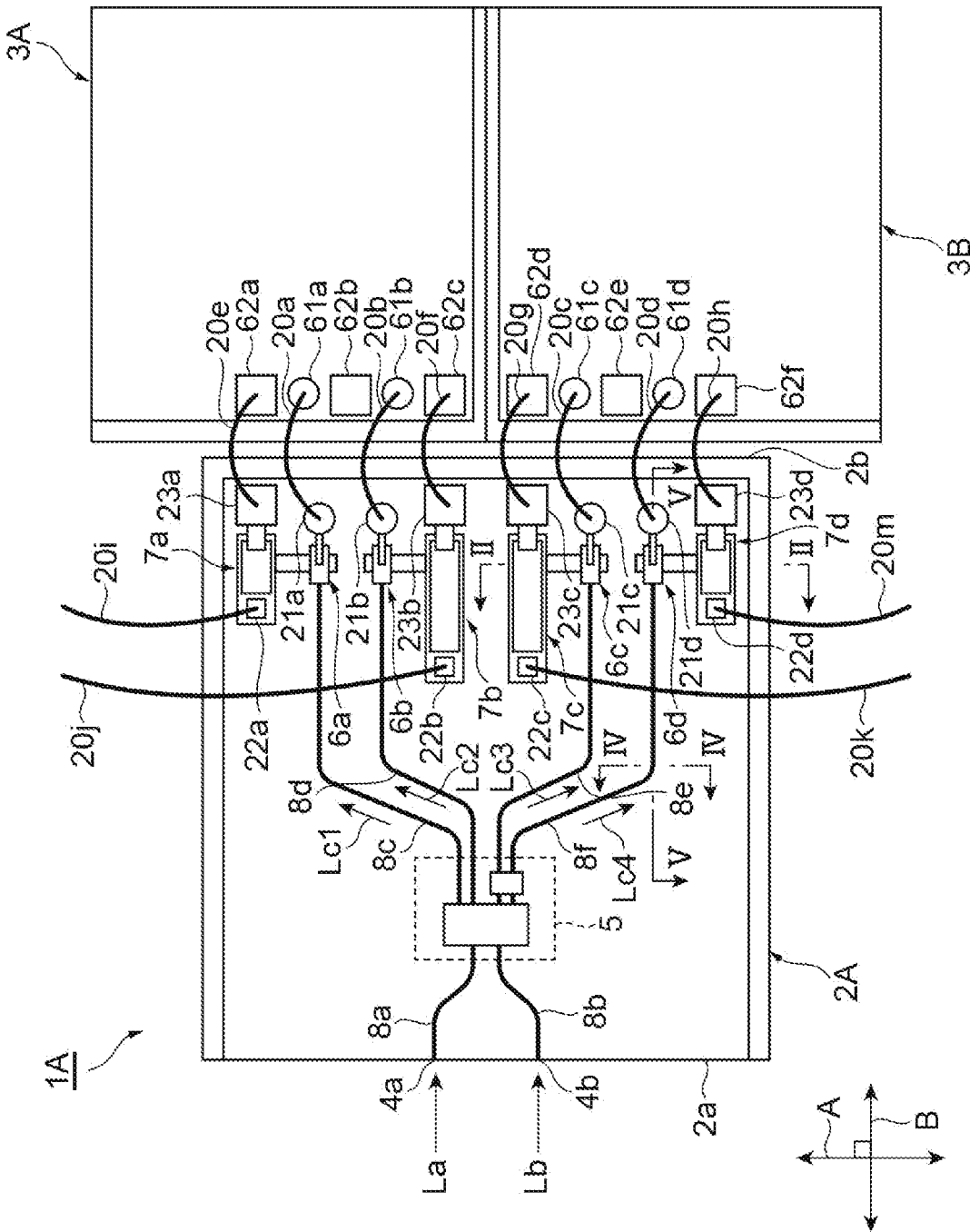
FIG. 1 is a plan view illustrating a configuration of a light receiving device including an optical waveguide type light receiving element as a semiconductor light receiving element according to a first embodiment.

Problem to be Solved by Present Disclosure

In recent years, optical waveguide type light receiving elements in which an optical waveguide structure and a waveguide type photodiode structure are integrated on a common substrate have been researched and developed. For example, such optical waveguide type light receiving elements are used as reception front ends of an optical transmission system which has a high transmission rate such as 40 Gb/s or faster and in which a multi-level modulation method and a digital coherent reception method are combined. An optical waveguide type light receiving element is produced by forming a butt joint structure constituted of a semiconductor lamination unit for a photodiode including an optical absorption layer and a semiconductor lamination unit for an optical waveguide including an optical waveguiding core layer on a substrate.

For example, as in the foregoing optical waveguide type light receiving element, a semiconductor light receiving element used as a reception front end of an optical transmission system may be required to have high reception sensitivity. As a solution therefor, it is conceivable to cause a waveguide type photodiode structure to have an avalanche multiplication action. In such a case, it is preferable to provide a multiplication layer for avalanche multiplication between an optical absorption layer constituting a photodiode and a semiconductor layer thereon. However, in many cases, a butt joint interface is formed through wet etching, and thus it is inclined with respect to a direction perpendicular to a main surface of a substrate (for example, refer to JP2013-110207A). Therefore, an end face (butt joint interface) of a multiplication layer is also inclined with respect to the direction. In such a case, depletion does not proceed in parts in the vicinity of the end face of the multiplication layer compared to other parts in the multiplication layer, and thus a depletion range of a part in the vicinity of the end face of the multiplication layer become narrow compared to depletion ranges of other parts in the multiplication layer. Therefore, a maximum electric field (Emax) becomes larger in a part in the vicinity of the end face of the multiplication layer than in other parts in the multiplication layer. As a result, edge breakdown is likely to occur.

Effects of Present Disclosure

According to a semiconductor light receiving element of the present disclosure, a depletion range of a multiplication layer for avalanche multiplication can be made approximately uniform.

DESCRIPTION OF EMBODIMENT OF PRESENT DISCLOSURE

According to an embodiment, there is provided a semiconductor light receiving element including a first semiconductor layer, a waveguide type photodiode structure, an optical waveguide structure, and a fourth semiconductor layer. The first semiconductor layer is of a first conductive type. The waveguide type photodiode structure has an end face provided on the first semiconductor layer. The waveguide type photodiode structure includes an optical absorption layer, a second semiconductor layer, a multiplication layer, and a third semiconductor layer. The optical absorption layer is of an intrinsic conductive type or a first conductive type. The second semiconductor layer is of a first conductive type. The multiplication layer is of an intrinsic conductive type or a first conductive type. The third semiconductor layer is of a second conductive type. The optical waveguide structure has an end face provided on the first semiconductor layer. The optical waveguide structure includes an optical waveguiding core layer and a cladding layer. The end face of the waveguide type photodiode structure faces to the end face of the optical waveguide structure. The fourth semiconductor layer is of a second conductive type. The fourth semiconductor layer is located between the end face of the waveguide type photodiode structure and the end face of the optical waveguide structure. The fourth semiconductor layer is contacted with the multiplication layer of the end face of the waveguide type photodiode structure.

In this semiconductor light receiving element, the waveguide type photodiode structure includes the multiplication layer and the second semiconductor layer. The multiplication layer is a carrier multiplication layer provided between the third semiconductor layer of a second conductive type and the optical absorption layer. The multiplication layer is of a first conductive type or an intrinsic conductive type. The second semiconductor layer is an electric field lowering layer provided between the multiplication layer and the optical absorption layer and is of a first conductive type. In this manner, since the waveguide type photodiode structure includes the multiplication layer and the second semiconductor layer, a waveguide type photodiode structure having an avalanche multiplication action can be obtained. As described above, when an end face of the multiplication layer is inclined, depletion does not proceed in a part in the vicinity of the end face of the multiplication layer compared to other parts in the multiplication layer, and thus a depletion range of a part in the vicinity of the end face of the multiplication layer become narrow compared to other parts in the multiplication layer. In contrast, in this semiconductor light receiving element, the fourth semiconductor layer of a second conductive type is provided between the optical waveguiding core layer and the waveguide type photodiode structure and comes into contact with the multiplication layer. In this case, at the time of applying a reverse bias, a part in the vicinity of the end face of the multiplication layer is supplemented with carriers from the fourth semiconductor layer, and thus the depletion range of a part in the vicinity of the end face of the multiplication layer expand. That is, according to this semiconductor light receiving element, the depletion range of the multiplication layer can be made approximately uniform from a central part to a part in the vicinity of the end face. As a result, partial increase in maximum electric field (Emax) in the multiplication layer is curbed, and edge breakdown can be made unlikely to occur.

In the foregoing semiconductor light receiving element, an impurity concentration of the fourth semiconductor layer may be lower than an impurity concentration of the third semiconductor layer. According to this configuration, compared to a case in which the impurity concentration of the fourth semiconductor layer is equal to or higher than the impurity concentration of the third semiconductor layer, an optical loss caused by the fourth semiconductor layer can be reduced.

The foregoing semiconductor light receiving element may further include a fifth semiconductor layer. The fifth semiconductor layer is provided between the first semiconductor layer and the optical absorption layer, is of a first conductive type having a lower impurity concentration than the first semiconductor layer, and extends between the first semiconductor layer and the optical waveguiding core layer. In this case, a depletion region at the time of applying a reverse bias expands from the optical absorption layer to the fifth semiconductor layer. Therefore, an electrostatic capacitance is reduced compared to a case in which the fifth semiconductor layer is not provided, and a CR time constant (C: capacitance, and R: resistance) can be further reduced. As a result, faster (broadband) high-frequency response characteristics can be realized.

In the foregoing semiconductor light receiving element, the waveguide type photodiode structure may further include a sixth semiconductor layer. The sixth semiconductor layer is provided between the first semiconductor layer and the optical absorption layer and is of a first conductive type having a lower impurity concentration than the first semiconductor layer. In this case, a center position of the optical absorption layer in a thickness direction can be accurately aligned with a center position of the optical waveguiding layer in the thickness direction by adjusting a thickness of the sixth semiconductor layer. Hence, even when the optical absorption layer is thinned, a coupling loss can be reduced by matching mode fields of the optical absorption layer and the optical waveguiding core layer.

The foregoing semiconductor light receiving element may further include a semiconductor passivation film provided in the waveguide type photodiode structure. Further, the optical absorption layer, the second semiconductor layer, the multiplication layer, and the third semiconductor layer may constitute a stripe mesa structure extending in a first direction that is an arrangement direction of the waveguide type photodiode structure and the optical waveguide structure. The stripe mesa structure may have a pair of side surfaces extending in the first direction. The semiconductor passivation film may come into contact with the pair of side surfaces. In this case, the fourth semiconductor layer does not come into contact with the pair of side surfaces of the stripe mesa structure. Accordingly, light which has been propagated in the optical waveguide structure can be efficiently incident on the waveguide type photodiode structure.

In the foregoing semiconductor light receiving element, an impurity concentration of the fourth semiconductor layer may be $3 \times 10^{16}$ cm$^{-3}$ or lower. In this case, the depletion region at the time of applying a reverse bias expands to the fourth semiconductor layer, and thus increase in electric field in the vicinity of the end face of the waveguide type photodiode structure can be curbed. Furthermore, a free carrier absorption loss generated at the time of optical propagation due to impurities can be curbed, and a transmittance of the optical waveguide can be improved.

In the foregoing semiconductor light receiving element, a bandgap of the fourth semiconductor layer may be larger than a bandgap of the optical absorption layer and may be equivalent to or smaller than a bandgap of the first semiconductor layer. In this case, a refractive index of the fourth semiconductor layer is equivalent to or larger than at least a refractive index of the first semiconductor layer. Therefore, propagated light can be incident on the waveguide type photodiode structure without impairing a confinement effect of propagated light within a waveguide.

According to another embodiment, there is provided a semiconductor light receiving element including a first semiconductor layer, a photodiode structure, and a seventh semiconductor layer. The first semiconductor layer is of a first conductive type. The photodiode structure is provided on the first semiconductor layer. The photodiode structure has an end face. The photodiode structure includes an optical absorption layer, a second semiconductor layer, a multiplication layer, and a third semiconductor layer. The optical absorption layer, is of an intrinsic conductive type or a first conductive type. The second semiconductor layer is of a first conductive type. The multiplication layer is of an intrinsic conductive type or a first conductive type. The third semiconductor layer is of a second conductive type. The seventh semiconductor layer is of a second conductive type. The seventh semiconductor layer is contacted with the multiplication layer on the end face of the photodiode structure.

Also in this semiconductor light receiving element, similar to the waveguide type photodiode structure in the semiconductor light receiving element described above, the photodiode structure includes the multiplication layer and the second semiconductor layer. Accordingly, a photodiode structure having an avalanche multiplication action can be obtained. Furthermore, in this semiconductor light receiving element, the seventh semiconductor layer of a second conductive type is provided adjacent to the photodiode structure. The seventh semiconductor layer comes into contact with the multiplication layer on the end face of the photodiode structure. Also in this case, at the time of applying a reverse bias, parts in the vicinity of the end face of the multiplication layer are supplemented with carriers from the seventh semiconductor layer, and thus the depletion ranges of parts in the vicinity of the end face of the multiplication layer expand. That is, according to this semiconductor light receiving element, the depletion range of the multiplication layer can be made approximately uniform from a central part to parts in the vicinity of the end face. As a result, partial increase in maximum electric field (Emax) in the multiplication layer is curbed, and edge breakdown can be made unlikely to occur.

DETAILS OF EMBODIMENT OF PRESENT INVENTION

Specific examples of a semiconductor light receiving element according to an embodiment of the present disclosure will be described below with reference to the drawings. The present invention is not limited to the examples, but is indicated by the appended claims and is intended to include all modifications within the meaning and scope equivalent to the appended claims. In the following description, the same elements will be designated by the same reference numerals in the description of the drawings, and redundant description will be omitted.

First Embodiment

An embodiment of the present disclosure relates to an avalanche photodiode (APD) used in high-speed and large capacitance optical communication systems. The embodiment of the present disclosure relates to realization of rapidity, high sensitivity performance, and high reliability using a waveguide structure. The embodiment of the present disclosure relates to a multi-channel integrated light receiving element in which a 90° hybrid function used in a digital coherent optical communication system is monolithically integrated. The embodiment of the present disclosure relates to realization of high sensitivity performance and high reliability using integration of an APD structure.

Figure 2:
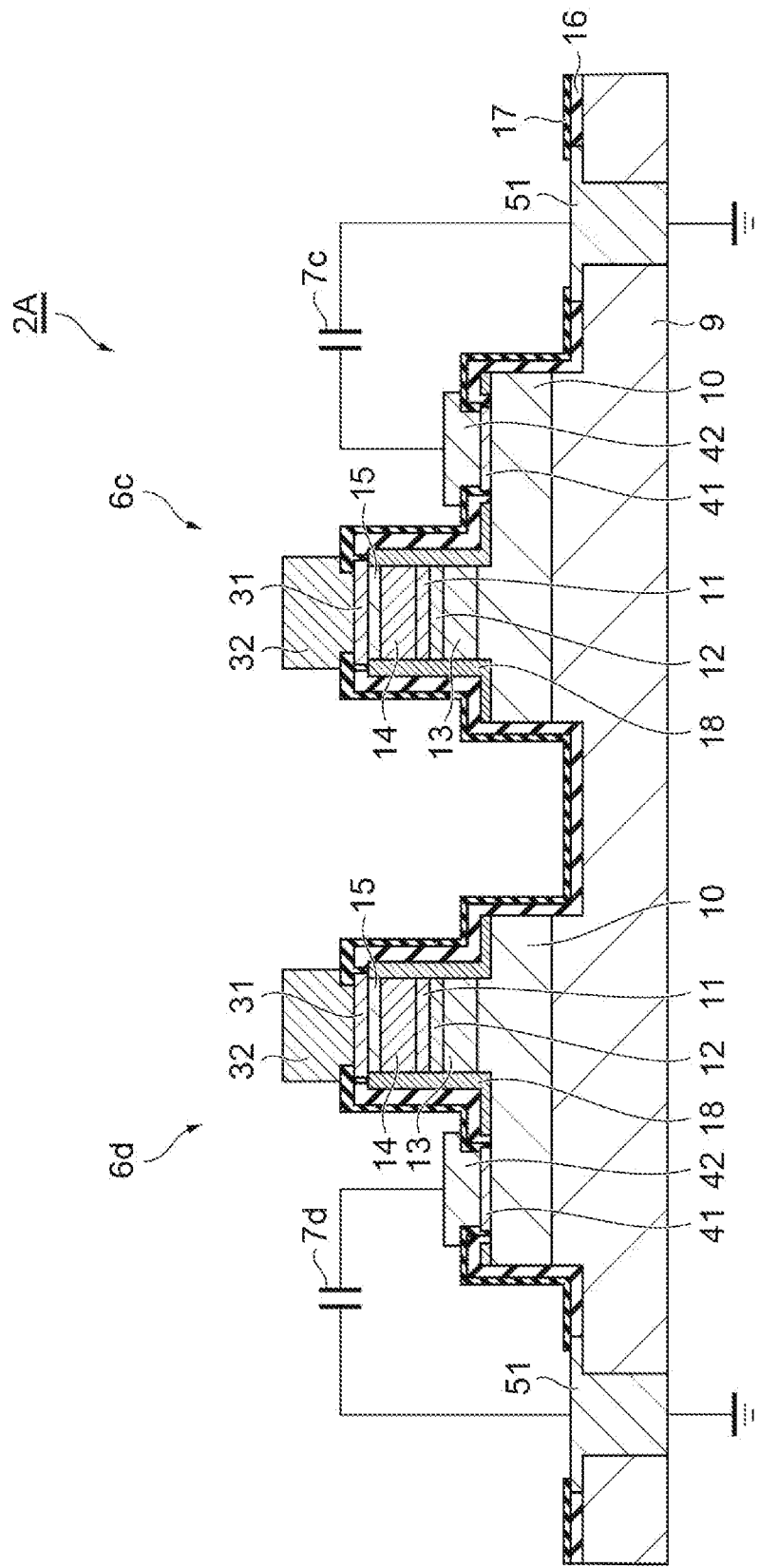
FIG. 2 is a view illustrating a cross section along line II-II illustrated in FIG. 1.
Figure 3:
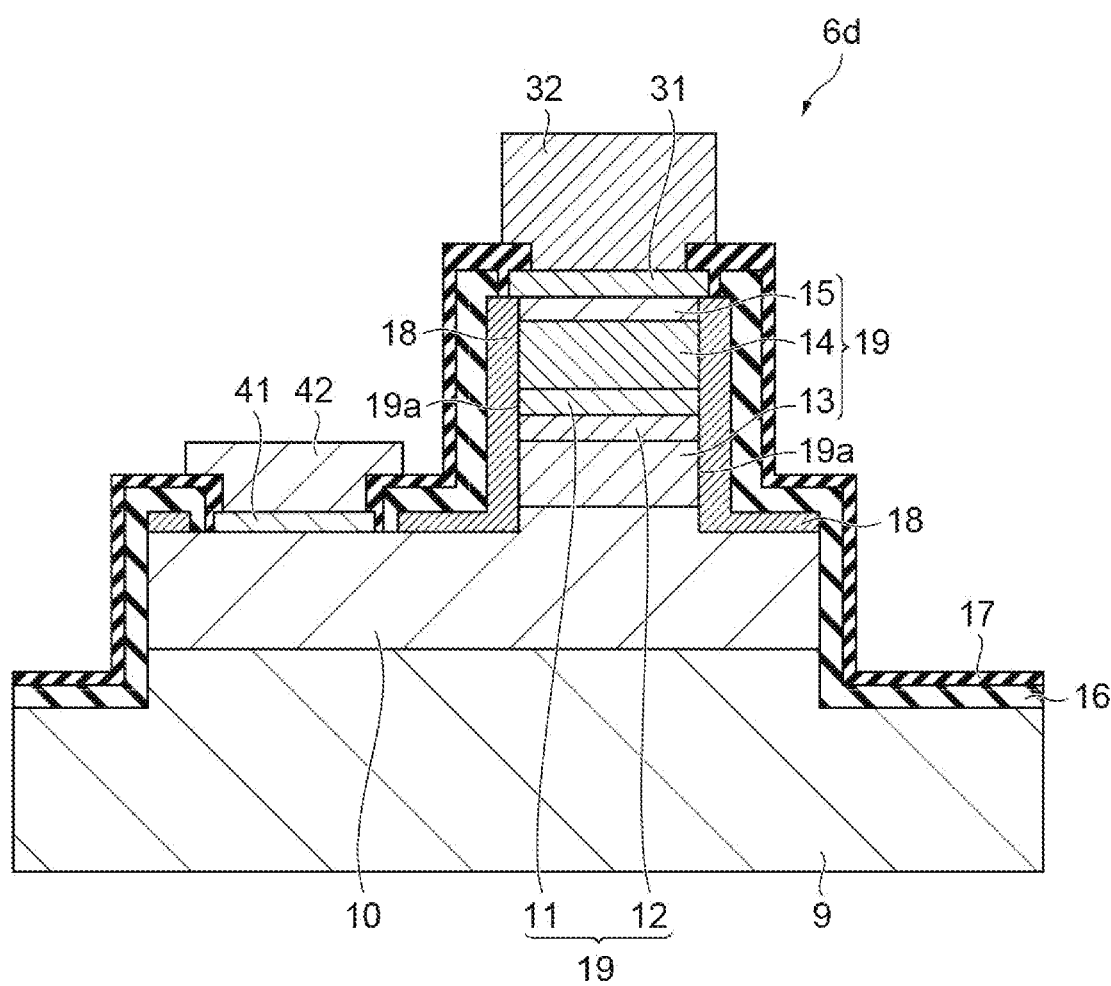
FIG. 3 is an enlarged cross-sectional view illustrating a part of FIG. 2.
Figure 4:
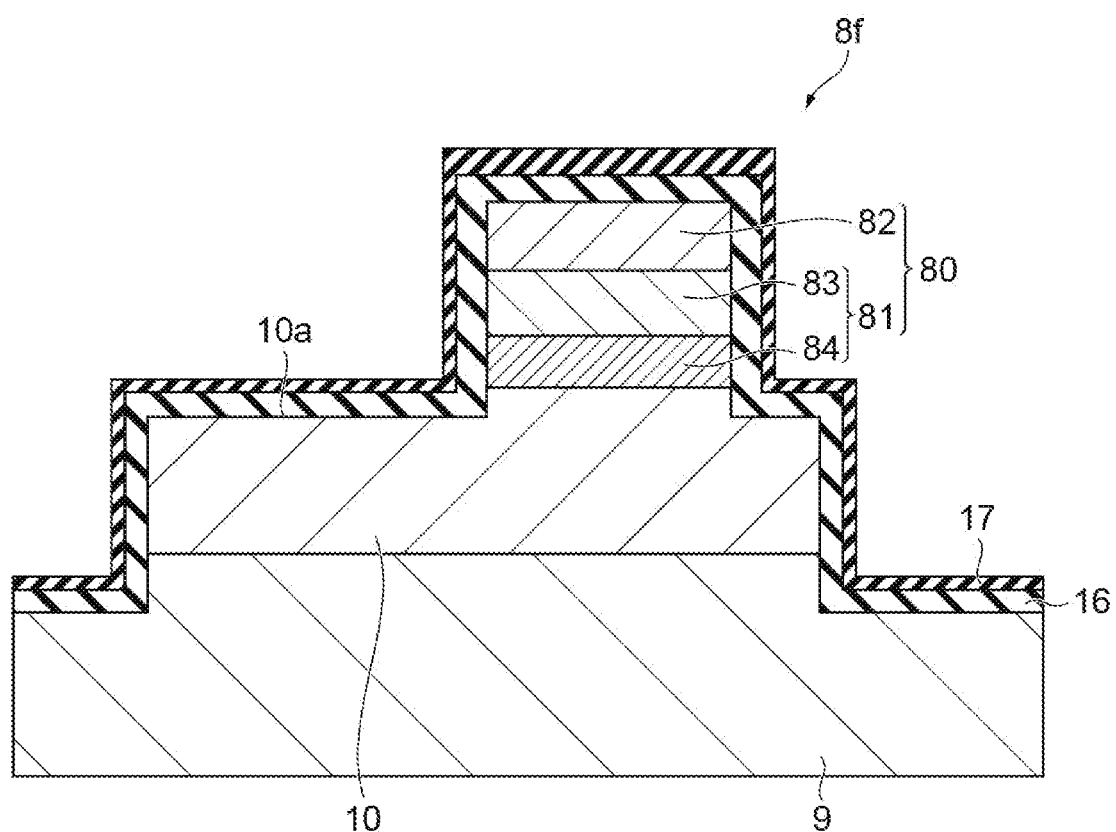
FIG. 4 is a view illustrating a cross section along line IV-IV illustrated in FIG. 1.
Figure 5:
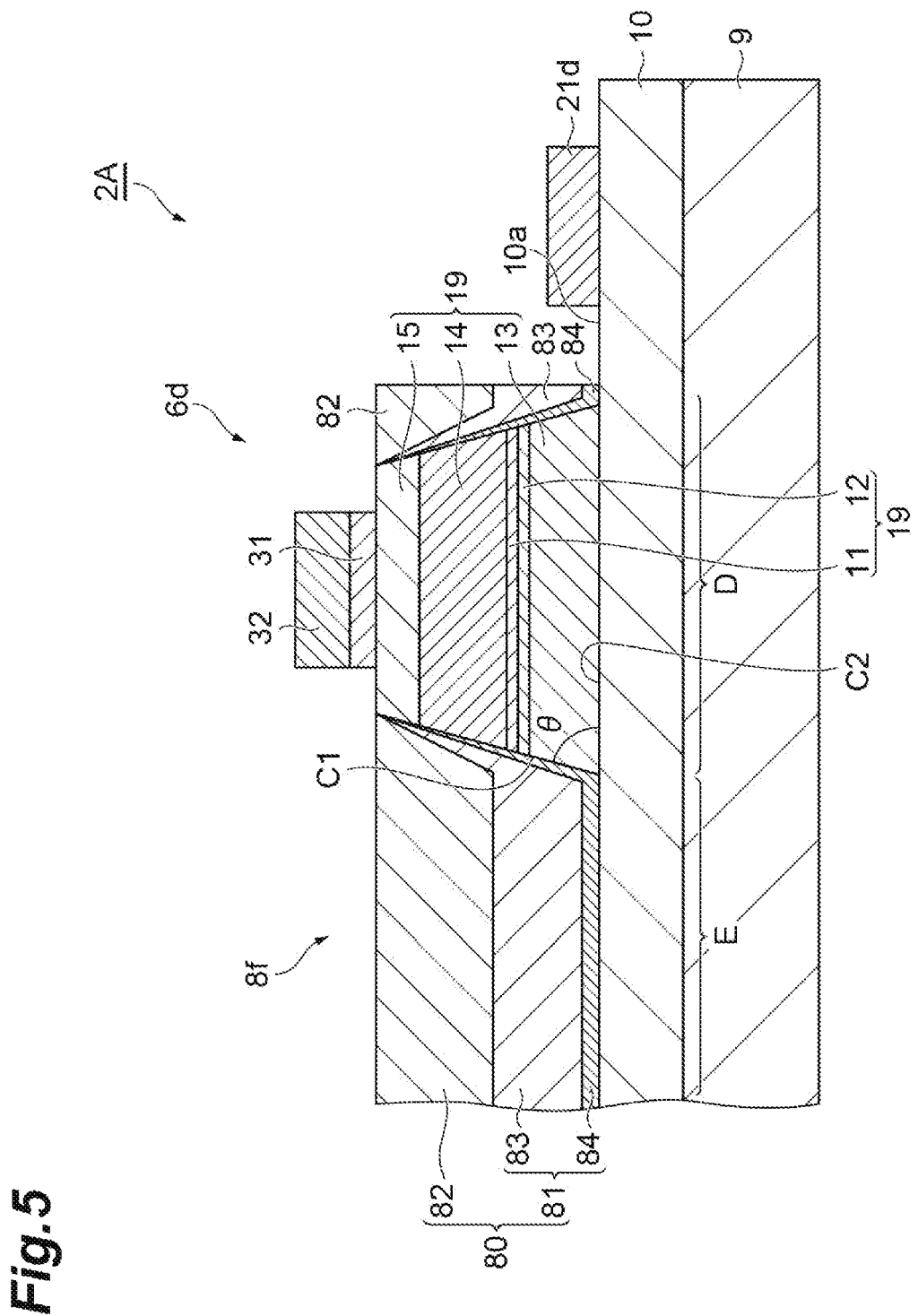
FIG. 5 is a view illustrating a cross section along line V-V illustrated in FIG. 1.

FIG. 1 is a plan view illustrating a configuration of a light receiving device including an optical waveguide type light receiving element as a semiconductor light receiving element according to a first embodiment. FIG. 2 illustrates a cross section along line II-II illustrated in FIG. 1. FIG. 3 is an enlarged view illustrating a part of FIG. 2. FIG. 4 illustrates a cross section along line IV-IV illustrated in FIG. 1. FIG. 5 illustrates a cross section along line V-V illustrated in FIG. 1. In FIG. 5, illustration of insulating films 16 and 17 is omitted.

As illustrated in FIG. 1, a light receiving device 1A according to the present embodiment includes an optical waveguide type light receiving element 2A and signal amplification units 3A and 3B. The light receiving element 2A has a flat surface shape such as a substantially rectangular shape. For example, the light receiving element 2A has a substrate made of a compound semiconductor such as InP, and an optical waveguide formed on the substrate. The light receiving element 2A has two input ports 4a and 4b and an optical branching portion (optical coupler) 5. The light receiving element 2A further has light receiving element portions 6a, 6b, 6c, and 6d formed on the substrate, and capacitor portions 7a, 7b, 7c, and 7d. That is, the light receiving element 2A has a structure in which the optical waveguide and the light receiving element portions 6a, 6b, 6c, and 6d are monolithically integrated on a common substrate.

The light receiving element 2A has a pair of end edges 2a and 2b extending in a predetermined direction A. The two input ports 4a and 4b are provided at the end edge 2a that is one of the end edges 2a and 2b of the light receiving element 2A. An optical signal La including four signal components modulated by a quadrature phase shift keying (QPSK) method is input from outside of the light receiving device 1A to the input port 4a that is one of the two input ports 4a and 4b. A local oscillation light Lb is input to the input port 4b. Each of the input ports 4a and 4b is optically coupled to the optical branching portion 5 via each of optical waveguide portions 8a and 8b. The optical waveguide portions 8a and 8b are constituted of a core layer and a cladding layer. The core layer is made of a material having a relatively large refractive index (for example, InGaAsP). The cladding layer is made of a material having a smaller refractive index (for example, InP) than the core layer and covers the core layer.

The optical branching portion 5 constitutes a 90° optical hybrid. The optical branching portion 5 is constituted of a multi-mode interference (MMI) coupler. The optical branching portion 5 causes the optical signal La and the local oscillation light Lb to interfere with each other, thereby branching the optical signal La into four signal components Lc1, Lc2, Lc3, and Lc4 modulated by the QPSK method. A polarization state of the signal component Lc1 is equivalent to a polarization state of the signal component Lc2, and the signal component Lc1 and the signal component Lc2 have an in-phase relationship. A polarization state of the signal component Lc3 is equivalent to a polarization state of the signal component Lc4, and the polarization states of the signal components Lc3 and Lc4 differ from the polarization states of the signal components Lc1 and Lc2. The signal components Lc3 and Lc4 have a quadrature relationship.

Each of the light receiving element portions 6a, 6b, 6c, and 6d has a configuration as an avalanche multiplication type PIN photodiode. The light receiving element portions 6a, 6b, 6c, and 6d are disposed side by side in this order along the end edge 2b of the light receiving element 2A. The light receiving element portions 6a, 6b, 6c, and 6d are optically coupled to corresponding output ports of the optical branching portion 5 via optical waveguide portions 8c, 8d, 8e, and 8f, respectively. A uniform bias voltage is supplied to cathodes of the light receiving element portions 6a, 6b, 6c, and 6d. Each of the light receiving element portions 6a, 6b, 6c, and 6d receives each of the four signal components Lc1, Lc2, Lc3, and Lc4 from the optical branching portion and generates an electrical signal (photoelectric current) corresponding to a light intensity of each of these signal components Lc1, Lc2, Lc3, and Lc4. Electrode pads 21a, 21b, 21c, and 21d are provided on the light receiving element 2A for outputting signals. The electrode pads 21a, 21b, 21c, and 21d are electrically connected to anodes of the light receiving element portions 6a, 6b, 6c, and 6d. The electrode pads 21a, 21b, 21c, and 21d are provided side by side in the direction A along the end edge 2b of the light receiving element 2A. Each of the electrode pads 21a, 21b, 21c, and 21d is electrically connected to each of electrode pads 61a, 61b, 61c, and 61d of the signal amplification units 3A and 3B via each of bonding wires 20a, 20b, 20c, and 20d.

The capacitor portions 7a, 7b, 7c, and 7d are so-called metal-insulator-metal (MIM) capacitors. The capacitor portions 7a, 7b, 7c, and 7d are constituted of a ground layer made of a semiconductor, a lower metal layer and an upper metal layer laminated on this ground layer, and an insulating film (the insulating film 17 illustrated in FIG. 2) interposed between the lower metal layer and the upper metal layer. For example, each of the lower metal layer and the upper metal layer has a laminated structure such as TiW/Au or Ti/Au/Pt. The capacitor portions 7a, 7b, 7c, and 7d are disposed side by side (adjacent to each other) in the direction A with respect to the respective light receiving element portions 6a, 6b, 6c, and 6d on the light receiving element 2A. Each of the capacitor portions 7a, 7b, 7c, and 7d is electrically connected between a bias wiring for supplying a bias voltage to each of the cathodes of the light receiving element portions 6a, 6b, 6c, or 6d and a reference potential wiring (GND line). An opening of the insulating film 17 is provided on a part of the lower metal layer which is not covered by the upper metal layer. A bias wiring 42 (refer to FIG. 2) is provided on the lower metal layer exposed through the opening. The lower metal layer is electrically connected to the bias wiring 42. The reference potential (GND) wiring is provided on the upper metal layer. The upper metal layer is electrically connected to the reference potential wiring. Due to each of the capacitor portions 7a, 7b, 7c, and 7d, an inductance component between each of the cathodes of the light receiving element portions 6a, 6b, 6c, and 6d and a by-pass capacitor (not illustrated) can be aligned in a design aspect.

Each of the capacitor portions 7a, 7b, 7c, and 7d has each of electrode pads 22a, 22b, 22c, and 22d (for a bias voltage) connected to the lower metal layer, and each of electrode pads 23a, 23b, 23c, and 23d (for a reference potential) connected to the upper metal layer. Each of the electrode pads 23a, 23b, 23c, and 23d is disposed between each of the electrode pads 22a, 22b, 22c, and 22d and the end edge 2b of the light receiving element 2A in a direction B intersecting (for example, orthogonal to) the direction A.

One end of each of bonding wires 20i, 20j, 20k, and 20m is connected to each of the electrode pads 22a, 22b, 22c, and 22d. The other end of each of the bonding wires 20i, 20j, 20k, and 20m is electrically connected to a bias voltage source (not illustrated). The bonding wires 20i, 20j, 20k, and 20m constitute parts of wirings for supplying a bias voltage to the respective light receiving element portions 6a, 6b, 6c, and 6d.

One end of each of bonding wires 20e, 20f, 20g, and 20h is connected to each of the electrode pads 23a, 23b, 23c, and 23d. Each of the bonding wires 20e, 20f, 20g, and 20h is provided along each of the bonding wires 20a, 20b, 20c, and 20d. The other end of each of the bonding wires 20e, 20f, 20g, and 20h is connected to each of electrode pads 62a, 62c, 62d, and 62f for a reference potential of the signal amplification units 3A and 3B.

The signal amplification units 3A and 3B are amplifiers (trans impedance amplifiers: TIA) for amplifying an electrical signal (photoelectric current) output from the light receiving element portions 6a, 6b, 6c, and 6d. The signal amplification unit 3A has two electrode pads 61a and 61b for inputting signals. The signal amplification unit 3A performs differential amplification of electrical signals input to the electrode pads 61a and 61b and generates one voltage signal. The signal amplification unit 3B has two electrode pads 61c and 61d for inputting signals. The signal amplification unit 3B performs differential amplification of electrical signals input to the electrode pads 61c and 61d and generates one voltage signal. The electrode pads 61a, 61b, 61c, and 61d are disposed side by side in this order along the end edge 2b of the light receiving element 2A and in the direction A. As described above, each of the electrode pads 61a, 61b, 61c, and 61d is electrically connected to each of the electrode pads 21a, 21b, 21c, and 21d via each of the bonding wires 20a, 20b, 20c, and 20d.

The signal amplification unit 3A further has three electrode pads 62a, 62b, and 62c. The electrode pads 62a, 62b, and 62c are disposed side by side in this order along the end edge 2b of the light receiving element 2A and in the direction A. The electrode pad 61a is disposed between the electrode pads 62a and 62b. The electrode pad 61b is disposed between the electrode pads 62b and 62c. Similarly, the signal amplification unit 3B further has three electrode pads 62d, 62e, and 62f. The electrode pads 62d, 62e, and 62f are disposed side by side in this order along the end edge 2b of the light receiving element 2A and in the direction A. The electrode pad 61c is disposed between the electrode pads 62d and 62e. The electrode pad 61d is disposed between the electrode pads 62e and 62f. As described above, each of the electrode pads 62a, 62c, 62d, and 62f of the signal amplification units 3A and 3B is electrically connected to each of the electrode pads 23a, 23b, 23c, and 23d via each of the bonding wires 20e, 20f, 20g, and 20h.

FIG. 2 illustrates cross-sectional structures of two light receiving element portions 6c and 6d of the four light receiving element portions 6a, 6b, 6c, and 6d. FIG. 3 illustrates a cross-sectional structure of the light receiving element portion 6d. The remaining light receiving element portions 6a and 6b have a cross-sectional structure similar to these. FIG. 4 illustrates a cross-sectional structure of one optical waveguide portion 8f of six optical waveguide portions 8a, 8b, 8c, 8d, 8e, and 8f. The remaining optical waveguide portions 8a, 8b, 8c, 8d, and 8e also have a cross-sectional structure similar to this. FIG. 5 illustrates a cross-sectional structure of a joint part between the light receiving element portion 6d and the optical waveguide portion 8f. A joint part between the light receiving element portion 6a and the optical waveguide portion 8c, a joint part between the light receiving element portion 6b and the optical waveguide portion 8d, and a joint part between the light receiving element portion 6c and the optical waveguide portion 8e also have a cross-sectional structure similar to this.

As illustrated in FIG. 5, the light receiving element portions 6a, 6b, 6c, and 6d and the optical waveguide portions 8c, 8d, 8e, and 8f are integrated on a common substrate 9. For example, the substrate 9 is a semi-insulating InP substrate. The cross-sectional structures of the light receiving element portions 6a, 6b, 6c, and 6d will be described by taking the light receiving element portion 6d as an example. As illustrated in FIG. 3, the light receiving element portion 6d has an n-type semiconductor layer 10 and a waveguide type photodiode structure 19. The n-type semiconductor layer 10 is provided on the substrate 9 and is of a high-concentration n-type conductive type (first conductive type). The photodiode structure 19 is provided on a region D (a first region, refer to FIG. 5) of the n-type semiconductor layer 10.

The photodiode structure 19 has an optical absorption layer 13, a semiconductor layer 14, and a p-type contact layer 15. The optical absorption layer 13 is provided on the n-type semiconductor layer 10. The semiconductor layer 14 is provided on the optical absorption layer 13 and is of a p-type conductive type (second conductive type). The p-type contact layer 15 is provided on the p-type semiconductor layer 14 and is of a p-type conductive type. Moreover, the photodiode structure 19 has a multiplication layer 11 and an n-type electric field control layer 12. The multiplication layer 11 is provided between the optical absorption layer 13 and the p-type semiconductor layer 14. The n-type electric field control layer 12 is provided between the multiplication layer 11 and the optical absorption layer 13. The n-type semiconductor layer 10 is a first semiconductor layer according to the present embodiment. The n-type electric field control layer 12 is a second semiconductor layer according to the present embodiment. The p-type semiconductor layer 14 is a third semiconductor layer according to the present embodiment.

The n-type semiconductor layer 10 comes into ohmic contact with an n-type ohmic electrode 41 (refer to FIG. 3). For example, the n-type semiconductor layer 10 is a Si-doped InP layer. For example, a Si-doping concentration of the n-type semiconductor layer 10 is $1 \times 10^{17}$ cm$^{-3}$ or higher. For example, a thickness of the n-type semiconductor layer 10 is within a range of 1 μm to 2 μm.

The optical absorption layer 13 is of an intrinsic (undoped) conductive type or an n-type conductive type having a lower impurity concentration than the n-type semiconductor layer 10. For example, the optical absorption layer 13 is an undoped InGaAs layer or a low-concentration n-type InGaAs layer of which the Si-doping concentration is $3 \times 10^{16}$ cm$^{-3}$ or lower. For example, a thickness of the optical absorption layer 13 is within a range of 0.1 μm to 0.4 μm. For example, the p-type semiconductor layer 14 is a Zn-doped InP layer. For example, a Zn-doping concentration of the p-type semiconductor layer 14 is $2 \times 10^{17}$ cm$^{-3}$ or higher. For example, a thickness of the p-type semiconductor layer 14 is within a range of 1 μm to 2.5 μm. For example, the p-type contact layer 15 is a Zn-doped InGaAs layer. For example, a Zn-doping concentration of the p-type contact layer 15 is $1 \times 10^{18}$ cm$^{-3}$ or higher. For example, a thickness of the p-type contact layer 15 is within a range of 0.1 μm to 0.3 μm.

The multiplication layer 11 is a hole injection type carrier multiplication layer. The multiplication layer 11 is of an intrinsic (undoped) conductive type or an n-type conductive type having a lower impurity concentration than the n-type semiconductor layer 10. In the present embodiment, an impurity concentration of the multiplication layer 11 is lower than an impurity concentration of the p-type semiconductor layer 14 and is lower than an impurity concentration of the n-type electric field control layer 12. For example, the multiplication layer 11 is an undoped InP layer. For example, a thickness of the multiplication layer 11 is within a range of 0.050 μm to 0.200 μm.

The n-type electric field control layer 12 is a layer provided to lower an electric field of the optical absorption layer 13. The n-type electric field control layer 12 is of an n-type conductive type having a higher impurity concentration than the optical absorption layer 13. A bandgap of the n-type electric field control layer 12 is larger than a bandgap of the optical absorption layer 13 and is equivalent to a bandgap of the n-type semiconductor layer 10 or smaller than the bandgap of the n-type semiconductor layer 10. For example, the n-type electric field control layer 12 is a Si-doped InP layer or a Si-doped InAlGaAs layer. For example, a Si-doping concentration of the n-type electric field control layer 12 is $1 \times 10^{18}$ cm$^{-3}$ or higher. For example, a thickness of the n-type electric field control layer 12 is within a range of 0.025 μm to 0.100 μm.

A composition graded layer may be provided between the optical absorption layer 13 and the n-type electric field control layer 12 for alleviating hetero-energy barriers (ΔEv and ΔEc) between both layers. This composition graded layer is of an undoped conductive type or an n-type conductive type of which the Si-doping concentration is $1 \times 10^{17}$ $cm^{-3}$ or lower. A p-type hetero-barrier alleviation layer may be provided between the p-type semiconductor layer 14 and the p-type contact layer 15. For example, this hetero-barrier alleviation layer is constituted of two Zn-doped InGaAsP layers of which the doping concentration is $1 \times 10^{18}$ $cm^{-3}$ or higher. For example, bandgap wavelengths of the two Zn-doped InGaAsP layers are 1.1 μm and 1.3 μm, respectively.

The light receiving element portion 6d further has a semiconductor passivation film 18 provided in the photodiode structure 19. A part of the n-type semiconductor layer 10, the optical absorption layer 13, the n-type electric field control layer 12, the multiplication layer 11, the p-type semiconductor layer 14, and the p-type contact layer constitute a stripe mesa structure extending in an optical waveguiding direction (first direction). The stripe mesa structure has a pair of side surfaces 19a extending in the optical waveguiding direction.

In the present embodiment, the optical waveguiding direction is the direction B intersecting or orthogonal to the direction A (refer to FIG. 1). The semiconductor passivation film 18 comes into contact with the entire surface of each of the side surfaces 19a. The semiconductor passivation film 18 constitutes an embedment region for embedding the photodiode structure 19 on both the side surfaces 19a. For example, the semiconductor passivation film 18 is formed of a semi-insulating material such as undoped InP or Zn-doped InP of which the doping concentration is $1 \times 10^{16}$ $cm^{-1}$ or lower. For example, a width of the stripe mesa structure in a direction orthogonal to the optical waveguiding direction (the direction A in FIG. 1) is within a range of 1.5 μm to 3 μm. For example, a height of the stripe mesa structure is within a range of 2 μm to 3.5 μm.

The light receiving element portion 6d further has the insulating films 16 and 17. The insulating films 16 and 17 are provided from an upper surface of the stripe mesa structure to a part on the semiconductor passivation film 18. The insulating films 16 and 17 cover and protect the upper surface of the stripe mesa structure and the semiconductor passivation film 18. For example, the insulating films 16 and 17 are films made of an insulating silicon compound such as SiN, SiON, or $SiO_2$. The insulating films 16 and 17 have an opening on the upper surface of the stripe mesa structure. A p-type ohmic electrode 31 is provided on the p-type contact layer 15 exposed from the insulating films 16 and 17 through the openings.

For example, the p-type ohmic electrode 31 is made of an alloy of AuZn or Pt and the p-type contact layer 15. A wiring 32 is provided on the p-type ohmic electrode 31. The wiring 32 extends in the optical waveguiding direction (the direction B in FIG. 1) and electrically connects the p-type ohmic electrode 31 and the electrode pad 21d to each other. For example, the wiring 32 has a laminated structure such as TiW/Au or Ti/Pt/Au. For example, the electrode pad 21d is formed through Au plating.

The insulating films 16 and 17 also have another opening on a part of the n-type semiconductor layer 10 located outside the mesa structure of the light receiving element portion 6d. The n-type ohmic electrode 41 serving as a cathode is provided on the n-type semiconductor layer 10 exposed from the insulating films 16 and 17 through the openings. For example, the n-type ohmic electrode 41 is made of an alloy of AuGe or AuGeNi and the n-type semiconductor layer 10. The bias wiring 42 is provided on the n-type ohmic electrode 41. The bias wiring 42 extends to the lower metal layer of the capacitor portion 7d and electrically connects the lower metal layer and the n-type ohmic electrode 41 to each other.

The capacitor portion 7d has the insulating film 16, the lower metal layer, the insulating film (interlayer film) 17, and the upper metal layer laminated in this order on the substrate 9. For example, the upper metal layer and the lower metal layer are constituted of a laminated structure such as TiW/Au or Ti/Au/Pt. On a part of the lower metal layer which is not covered by the upper metal layer, an opening is formed in the insulating film 17. The bias wiring 42 is provided on the lower metal layer exposed through the opening. The bias wiring 42 extends in a direction in which it becomes farther from the end edge 2b of the light receiving element 2A in the optical waveguiding direction (the direction B in FIG. 1) and electrically connects the lower metal layer and the electrode pad 22d to each other. A wiring connected to the electrode pad 23d is provided on the upper metal layer. This wiring extends in a direction in which it becomes closer to the end edge 2b of the light receiving element 2A in the optical waveguiding direction and electrically connects the upper metal layer and the electrode pad 23d to each other.

A via 51 is provided on the substrate 9. The via 51 is a metal conductive material and is formed through Au plating, for example. The via 51 is provided in a manner of penetrating the substrate 9 from a front surface to a rear surface. The upper metal layer of the capacitor portion 7d is electrically connected to one end of the via 51 on the front surface side via the electrode pad 23d. The other end of the via 51 on the rear surface side is connected to a reference potential line (ground potential line) shared between the signal amplification units 3A and 3B.

For example, the wiring connected to the electrode pad 23d, and the bias wiring 42 have a laminated structure such as TiW/Au or Ti/Au/Pt. For example, the electrode pad 23d and the electrode pad 22d are formed through Au plating.

Subsequently, a cross-sectional structure of the optical waveguide portion will be described. As illustrated in FIGS. 4 and 5, the optical waveguide portion 8f includes the n-type semiconductor layer 10 and an optical waveguide structure 80. The n-type semiconductor layer 10 is provided on the substrate 9. The optical waveguide structure 80 is provided on a region E (second region) of the n-type semiconductor layer 10. The region E is adjacent to the region D of the n-type semiconductor layer 10 in the optical waveguiding direction (the direction B in FIG. 1). The optical waveguide structure 80 includes an optical waveguiding layer 81 provided on the n-type semiconductor layer 10 and a cladding layer 82 provided on the optical waveguiding layer 81.

The n-type semiconductor layer 10 is in common with the n-type semiconductor layer 10 of the light receiving element portion 6d and functions as a lower cladding layer in the optical waveguide portion 8f. The n-type semiconductor layer 10 is provided from the light receiving element portion 6d to the optical waveguide portion 8f on the substrate 9. The composition, the doping concentration, and the thickness of the n-type semiconductor layer 10 in the optical waveguide portions 8a, 8b, 8c, 8d, 8e, and 8f are the same as those of the n-type semiconductor layer 10 in the light receiving element portion 6d.

As illustrated in FIG. 5, the optical waveguide portion 8f forms a butt joint coupling with the light receiving element portion 6d, and the optical waveguiding layer 81 comes into contact with the optical absorption layer 13. Accordingly, the optical waveguiding layer 81 is optically coupled to the optical absorption layer 13. For example, a butt joint interface is formed through wet etching. Hence, the butt joint interface is inclined with respect to a direction perpendicular to an upper surface 10a of the n-type semiconductor layer 10, that is, an interface between the n-type semiconductor layer 10 and the optical absorption layer 13. In other words, when an interface between the optical waveguide structure 80 and the photodiode structure 19 is a first interface C1 and an interface between the region D of the n-type semiconductor layer 10 and the photodiode structure 19 is a second interface C2, an angle θ formed by the first interface C1 and the second interface C2 is smaller than 90°. For example, the angle θ formed by the first interface C1 and the second interface C2 is within a range of 25° to 60°.

The optical waveguiding layer 81 includes an optical waveguiding core layer 83 and a p-type semiconductor layer 84 (fourth semiconductor layer). The p-type semiconductor layer 84 is provided on the region E of the n-type semiconductor layer 10. The optical waveguiding core layer 83 is provided on the p-type semiconductor layer 84. That is, the p-type semiconductor layer 84 is provided between the region E of the n-type semiconductor layer 10 and the optical waveguiding core layer 83.

The optical waveguiding core layer 83 has a larger refractive index than the n-type semiconductor layer 10 and is formed of a material which can be subjected to lattice matching with the n-type semiconductor layer 10. For example, the optical waveguiding core layer 83 is made of InGaAsP. For example, a bandgap wavelength of InGaAsP of the optical waveguiding core layer 83 is 1.05 μm. For example, a thickness of the optical waveguiding core layer 83 is within a range of 0.3 μm to 0.5 μm.

The p-type semiconductor layer 84 has a larger refractive index than the n-type semiconductor layer 10 and is formed of a material which can be subjected to lattice matching with the n-type semiconductor layer 10. A bandgap of the p-type semiconductor layer 84 is larger than the bandgap of the optical absorption layer 13 and is equivalent to the bandgap of the n-type semiconductor layer 10 or smaller than the bandgap of the n-type semiconductor layer 10. For example, a material of the p-type semiconductor layer 84 is InGaAsP. As an example, a bandgap wavelength of InGaAsP of the p-type semiconductor layer 84 is equivalent to that of the optical waveguiding core layer 83. For example, the bandgap wavelength of InGaAsP of the p-type semiconductor layer 84 is 1.05 μm. An impurity concentration of the p-type semiconductor layer 84 is lower than the impurity concentration of the p-type semiconductor layer 14. For example, the p-type semiconductor layer 84 is a low-concentration p-type InGaAsP layer of which the Zn-doping concentration is $3 \times 10^{16}$ cm$^{-3}$ or lower. For example, a thickness of a part on the region E in the p-type semiconductor layer 84 is within a range of 0.050 μm to 0.200 μm.

The p-type semiconductor layer 84 ascends on an end face of the photodiode structure 19 along the first interface C1 and extends between the optical waveguiding core layer 83 and the photodiode structure 19. The p-type semiconductor layer 84 comes into contact with the optical absorption layer 13, the n-type electric field control layer 12, the multiplication layer 11, and the p-type semiconductor layer 14 in the first interface C1. For example, a thickness of a part adjacent to the multiplication layer 11 in the p-type semiconductor layer 84 is within a range of 0.05 μm to 0.5 μm.

The cladding layer 82 has a smaller refractive index than the optical waveguiding layer 81 and is formed of a material which can be subjected to lattice matching with the optical waveguiding layer 81. For example, the cladding layer 82 is made of undoped InP. For example, a thickness of the cladding layer 82 is within a range of 1 μm to 3 μm, and a height of an upper surface of the cladding layer 82 is aligned with a height of an upper surface of the p-type contact layer 15.

As illustrated in FIG. 4, a part of the n-type semiconductor layer 10, the optical waveguiding layer 81, and the cladding layer 82 constitute a mesa structure extending in the optical waveguiding direction (the direction B in FIG. 1). An optical signal is confined inside the optical waveguiding layer 81 due to this mesa structure and a difference between refractive indices of the n-type semiconductor layer 10, the cladding layer 82, and the optical waveguiding layer 81. So that the optical signal can be propagated to the light receiving element portion 6d. The side surfaces and the upper surface of this mesa structure are protected by being covered by the insulating films 16 and 17.

Effects obtained by the light receiving element 2A of the present embodiment having the foregoing configuration will be described. In the light receiving element 2A, the photodiode structure 19 includes the multiplication layer 11 and the n-type electric field control layer 12. The multiplication layer 11 is a carrier multiplication layer provided between the p-type semiconductor layer 14 and the optical absorption layer 13. The multiplication layer 11 is of a n-type conductive type having a lower impurity concentration than the n-type electric field control layer 12 or is an undoped layer. The n-type electric field control layer 12 is an electric field lowering layer provided between the multiplication layer 11 and the optical absorption layer 13 and is of an n-type conductive type. Since the photodiode structure 19 includes the multiplication layer 11 and the n-type electric field control layer 12, the photodiode structure 19 having an avalanche multiplication action can be obtained.

Figure 6:
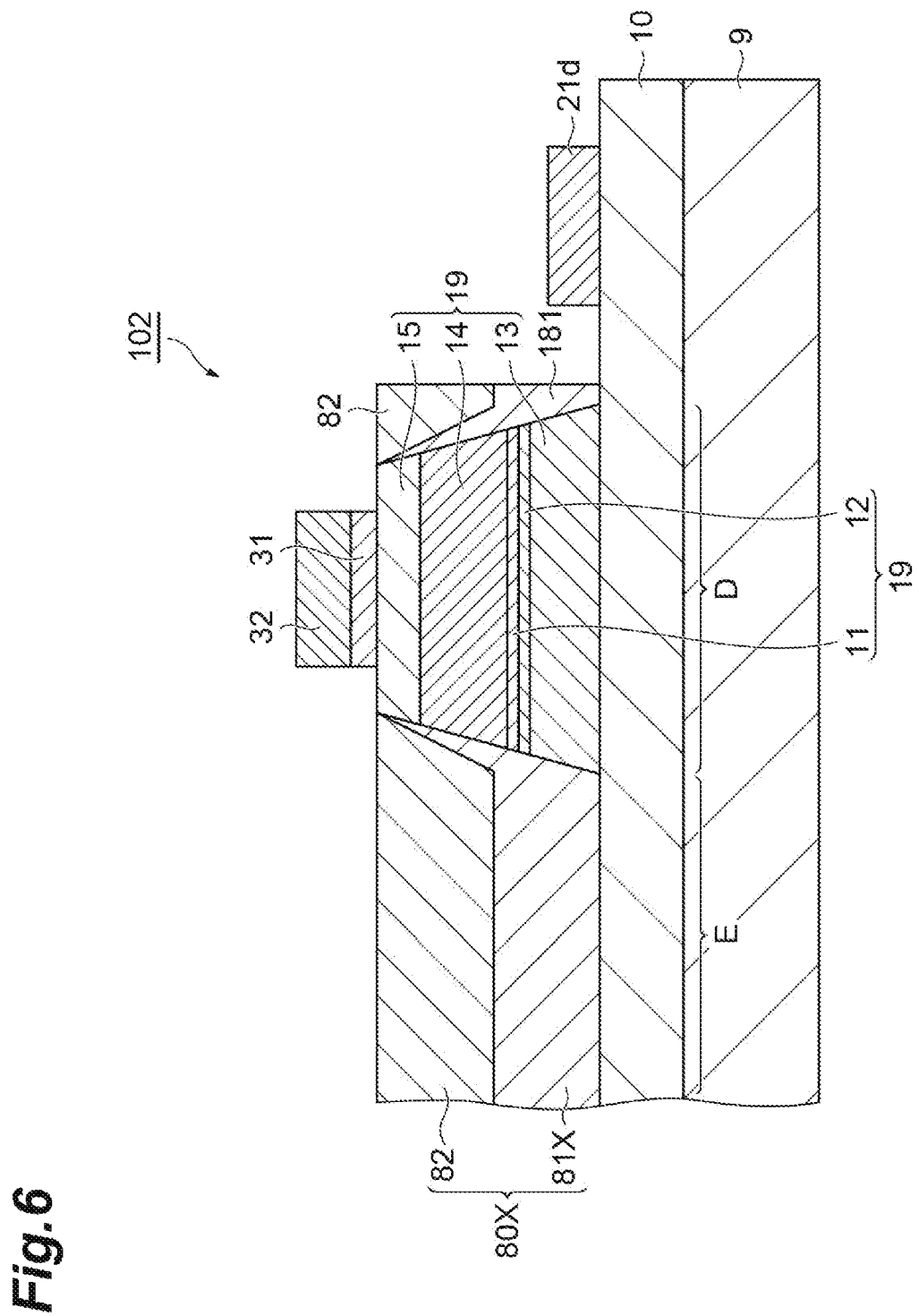
FIG. 6 is a cross-sectional view illustrating a structure of an optical waveguide type light receiving element as a comparative example and illustrates a cross section corresponding to line V-V in FIG. 1.
Figure 7A:
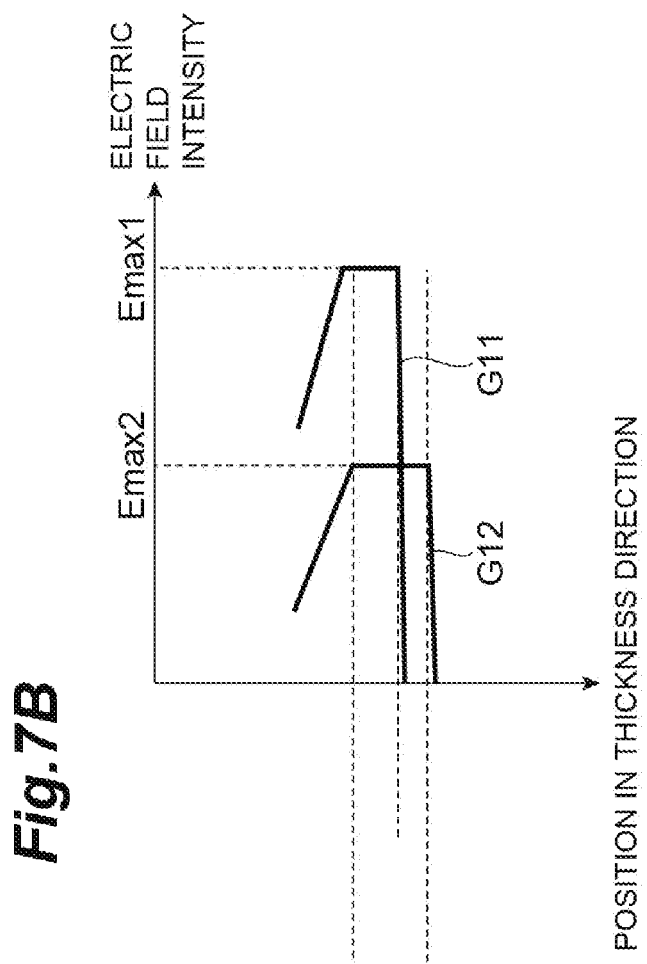
FIGS. 7A and 7B are views for describing a depletion range and an electric field intensity in the comparative example.
Figure 7B:
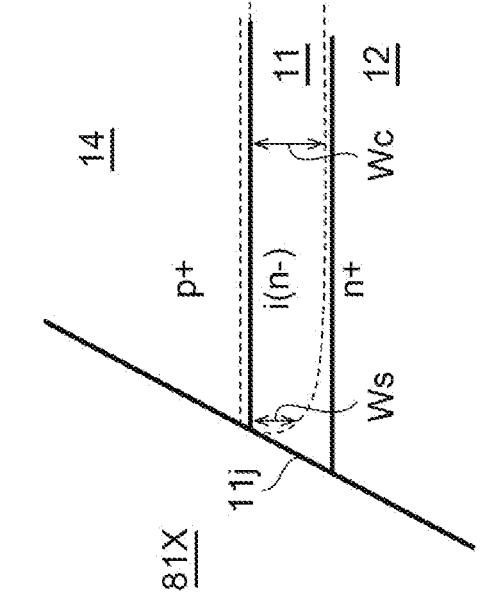

FIG. 6 is a cross-sectional view illustrating a structure of an optical waveguide type light receiving element 102 as a comparative example, and illustrates a cross section corresponding to line V-V in FIG. 1. FIGS. 7A and 7B are views for describing a depletion range and an electric field intensity in the comparative example. The optical waveguide type light receiving element 102 differs from the light receiving element 2A in including an optical waveguide structure 80X in place of the optical waveguide structure 80, and the configuration thereof is otherwise similar to that of the light receiving element 2A. The optical waveguide structure 80X includes an optical waveguiding layer 81X and the cladding layer 82. The optical waveguiding layer 81X is constituted of only an optical waveguiding core layer and does not have the p-type semiconductor layer 84. The optical waveguiding core layer constituting the optical waveguiding layer 81X is made of the same material (for example, InGaAsP) as the optical waveguiding core layer 83. In addition, the bandgap wavelength of InGaAsP of the optical waveguiding core layer constituting the optical waveguiding layer 81X is equivalent to that of the optical waveguiding core layer 83.

In many cases, since the butt joint interface is formed through wet etching, it becomes a forward mesa structure and is inclined to the photodiode side with respect to a direction perpendicular to a main surface of the substrate 9. Therefore, an end face of the multiplication layer 11 is also inclined in a similar manner. FIG. 7A is an enlarged view of a part in the vicinity of the end face of the multiplication layer 11 in such a case. A region surrounded by the dotted line in the diagram shows a depleted region. When an end face 11j of the multiplication layer 11 is inclined, a length of an interface between the n-type electric field control layer 12 and the multiplication layer 11 in the optical waveguiding direction becomes shorter than a length of an interface between the optical absorption layer 13 and the multiplication layer 11 in the same direction in accordance with an inclination angle thereof. Hence, if the p-type semiconductor layer 84 does not extend between the optical waveguiding core layer 83 and the photodiode structure 19, negative electric charges become insufficient in a part in the vicinity of the end face 11*j* of the multiplication layer 11 when a reverse bias is applied. As a result, depletion does not proceed compared to other parts in the multiplication layer 11, and a depletion range Ws of the part becomes narrow compared to a depletion range We of other parts.

FIG. 7B is a view illustrating change in electric field intensity in a thickness direction. The graph G11 shows change in electric field intensity of a part in the vicinity of the end face 11*j* of the multiplication layer 11. The graph G12 shows change in electric field intensity of other parts in the multiplication layer 11. As illustrated in FIG. 7B, due to the relationship between the foregoing depletion ranges Ws and Wc, a maximum electric field Emax1 in a part in the vicinity of the end face 11*j* of the multiplication layer 11 becomes larger than a maximum electric field Emax2 of other parts in the multiplication layer 11. Therefore, edge breakdown is likely to occur in the butt joint interface. Furthermore, a multiplication current is concentrated in a part in the vicinity of the end face 11*j*, and thus reliability deteriorates.

Figure 8A:
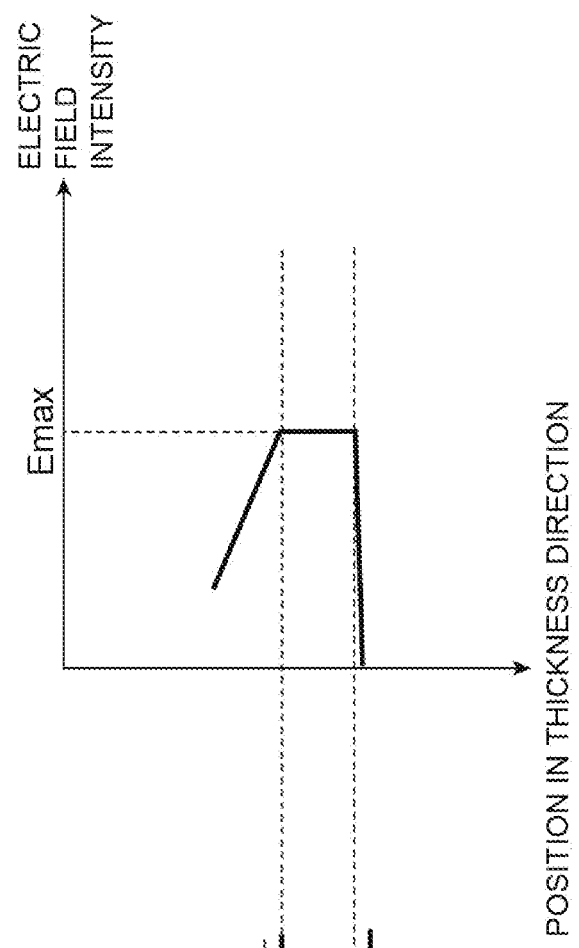
FIGS. 8A and 8B are views for describing a depletion range and an electric field intensity in the first embodiment.
Figure 8B:
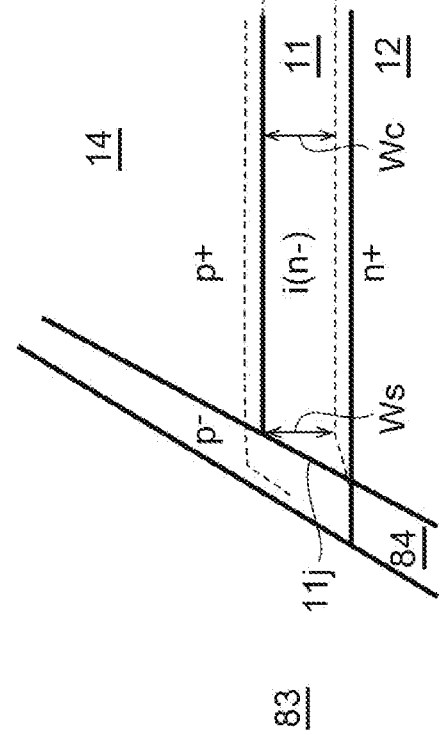

In the light receiving element 2A of the present embodiment, the p-type semiconductor layer 84 extends between the optical waveguiding core layer 83 and the photodiode structure 19 and comes into contact with the multiplication layer 11 and the n-type electric field control layer 12 in the first interface C1. FIGS. 8A and 8B are views for describing a depletion range and an electric field intensity according to the present embodiment. FIG. 8A is an enlarged view of a part in the vicinity of the end face of the multiplication layer 11 of the present embodiment. A region surrounded by the dotted line in the diagram shows a depleted region. When the p-type semiconductor layer 84 extends between the optical waveguiding core layer 83 and the photodiode structure 19, a part in the vicinity of the end face 11*j* of the multiplication layer 11 is supplemented with carriers from the p-type semiconductor layer 84 at the time of applying a reverse bias. Accordingly, as illustrated in FIG. 8A, the depletion range Ws of a part in the vicinity of the end face 11*j* of the multiplication layer 11 expands. Hence, the depletion range is made approximately uniform to the butt joint interface, and unevenness of the depletion range caused by inclination of the end face 11*j* is reduced. That is, according to the light receiving element 2A of the present embodiment, the depletion range of the multiplication layer 11 can be made approximately uniform.

FIG. 8B is a view illustrating change in electric field intensity of the multiplication layer 11 in the thickness direction. According to the present embodiment, a maximum electric field Emax of a part in the vicinity of the end face 11*j* of the multiplication layer 11 becomes equivalent to a maximum electric field of other parts in the multiplication layer 11. That is, partial increase in maximum electric field Emax in the multiplication layer 11 can be curbed. Therefore, edge breakdown can be made unlikely to occur. Furthermore, deterioration in reliability due to concentration of a multiplication current can be avoided.

As in the present embodiment, the impurity concentration of the p-type semiconductor layer 84 may be lower than the impurity concentration of the p-type semiconductor layer 14. According to this configuration, compared to a case in which the impurity concentration of the p-type semiconductor layer 84 is equal to or higher than the impurity concentration of the p-type semiconductor layer 14, an optical loss caused by the p-type semiconductor layer 84 can be reduced.

As in the present embodiment, the light receiving element 2A may further include the semiconductor passivation film 18 provided in the photodiode structure 19. The optical absorption layer 13, the n-type electric field control layer 12, the multiplication layer 11, and the p-type semiconductor layer 14 constitute a stripe mesa structure extending in the optical waveguiding direction (the direction B in FIG. 1), and the stripe mesa structure may have the pair of side surfaces 19*a* extending in the optical waveguiding direction. The semiconductor passivation film 18 may come into contact with the pair of side surfaces 19*a*. In this case, the p-type semiconductor layer 84 does not come into contact with the pair of side surfaces 19*a* of the stripe mesa structure. Accordingly, light which has been propagated in the optical waveguide structure 80 can be efficiently incident on the photodiode structure 19.

As in the present embodiment, the impurity concentration of the p-type semiconductor layer 84 may be $3\times10^{16}$ cm$^{-3}$ or lower. According to this configuration, a depletion region at the time of applying a reverse bias expands to the p-type semiconductor layer 84, and increase in electric field in the vicinity of the first interface C1 of the photodiode structure 19 can be curbed. In addition, a free carrier absorption loss generated at the time of optical propagation due to impurities can be curbed, and a transmittance of the waveguide can be improved.

As in the present embodiment, the bandgap of the p-type semiconductor layer 84 may be larger than the bandgap of the optical absorption layer 13 and may be equivalent to or smaller than the bandgap of the n-type semiconductor layer 10. According to this configuration, a refractive index of the p-type semiconductor layer 84 is equivalent to or larger than a refractive index of the n-type semiconductor layer 10. Hence, propagated light can be efficiently incident on the photodiode structure 19 without impairing a confinement effect of propagated light within the waveguide.

(First Modification)

Figure 9:
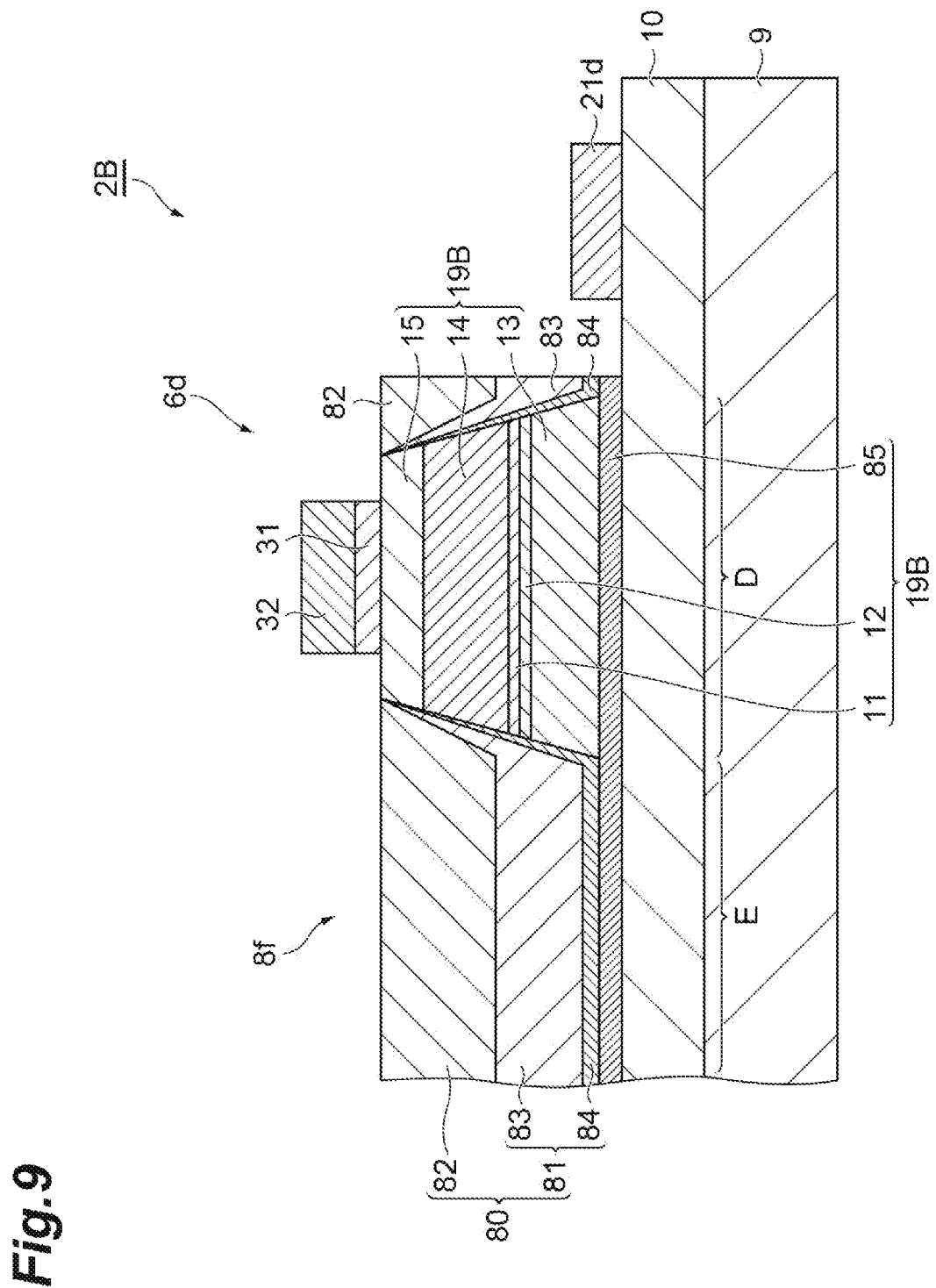
FIG. 9 is a cross-sectional view illustrating a structure of an optical waveguide type light receiving element according to a first modification and illustrates a cross section corresponding to line V-V in FIG. 1.

FIG. 9 is a cross-sectional view illustrating a structure of an optical waveguide type light receiving element 2B according to a first modification of the foregoing embodiment and illustrates a cross section corresponding to line V-V in FIG. 1. The light receiving element 2B differs from the light receiving element 2A in including a photodiode structure 19B in place of the photodiode structure 19, and the configuration thereof is otherwise similar to that of the light receiving element 2A. In addition to the configuration of the photodiode structure 19, the photodiode structure 19B further includes a buffer layer 85 (fifth semiconductor layer).

The buffer layer 85 is provided between the n-type semiconductor layer 10 and the optical absorption layer 13 and extends from a part on the region D to a part on the region E of the n-type semiconductor layer 10. The buffer layer 85 is of an n-type conductive type having a lower impurity concentration than the n-type semiconductor layer 10 or an undoped conductive type. For example, the buffer layer 85 is a Si-doped InP layer. For example, a Si-doping concentration of the buffer layer 85 is $1\times10^{16}$ cm$^{-3}$ or lower. For example, a thickness of the buffer layer 85 is within a range of 0.050 µm to 0.300 µm. In the optical waveguide portion 8*f*, the buffer layer 85 is provided between the p-type semiconductor layer 84 and the n-type semiconductor layer 10 and functions as a second lower cladding layer.

In the present modification, the depletion region at the time of applying a reverse bias expands from the optical absorption layer 13 to the buffer layer 85. Therefore, an electrostatic capacitance is reduced compared to a case in which the buffer layer 85 is not provided, and a CR time constant can be further reduced. As a result, faster (broadband) high-frequency response characteristics can be realized.

(Second Modification)

Figure 10:
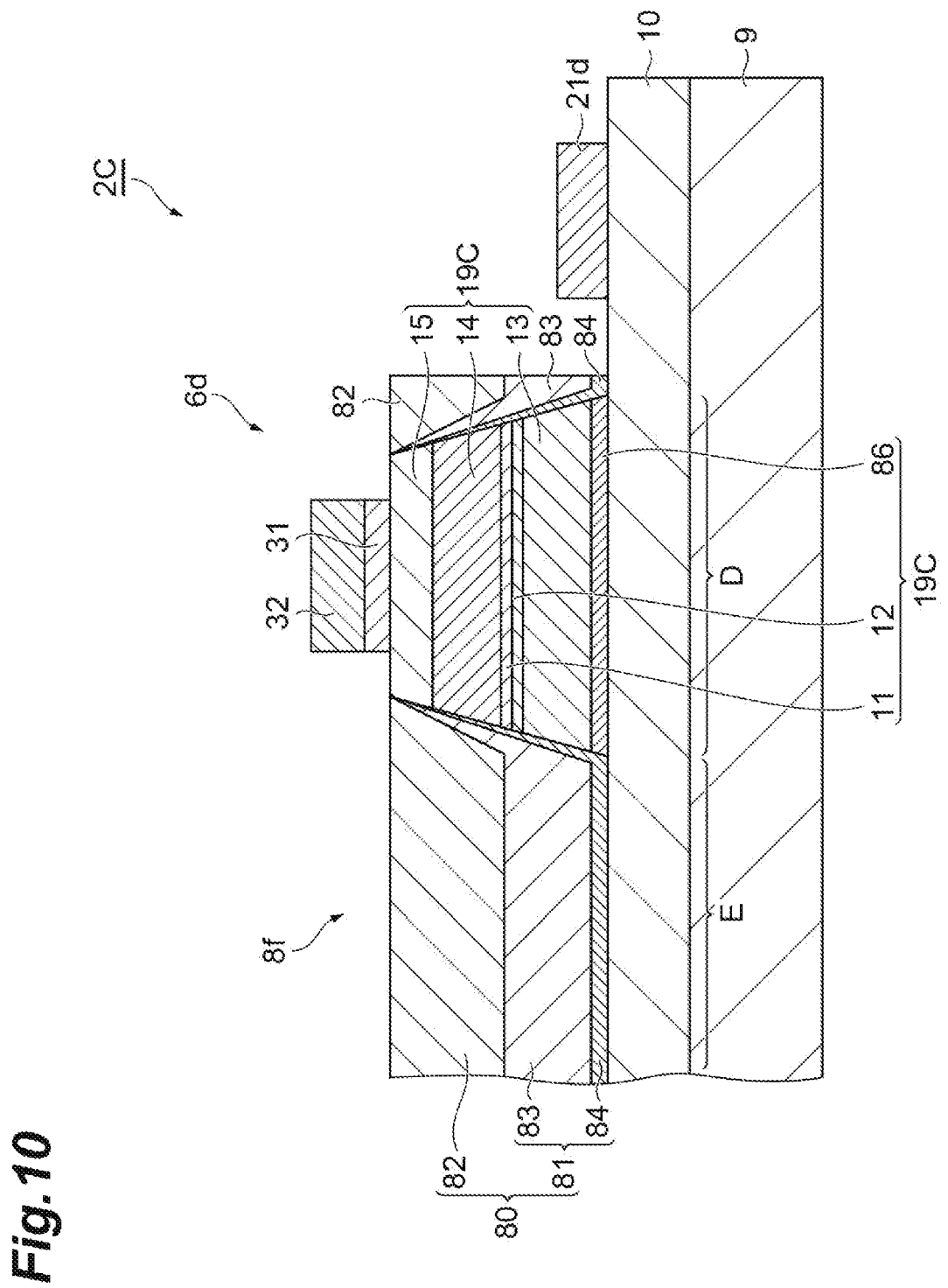
FIG. 10 is a cross-sectional view illustrating a structure of an optical waveguide type light receiving element according to a second modification and illustrates a cross section corresponding to line V-V in FIG. 1.

FIG. 10 is a cross-sectional view illustrating a structure of an optical waveguide type light receiving element 2C according to a second modification of the foregoing embodiment and illustrates a cross section corresponding to line V-V in FIG. 1. The light receiving element 2C differs from the light receiving element 2A in including a photodiode structure 19C in place of the photodiode structure 19, and the configuration thereof is otherwise similar to that of the light receiving element 2A. In addition to the configuration of the photodiode structure 19, the photodiode structure 19C further includes a hetero-barrier alleviation layer 86 (sixth semiconductor layer).

The hetero-barrier alleviation layer 86 is provided between the region D of the n-type semiconductor layer 10 and the optical absorption layer 13. The hetero-barrier alleviation layer 86 does not extend to a part on the region E of the n-type semiconductor layer 10. The hetero-barrier alleviation layer 86 is provided to alleviate the hetero-energy barrier between the n-type semiconductor layer 10 and the optical absorption layer 13.

The hetero-barrier alleviation layer 86 is of an n-type conductive type having a lower impurity concentration than the n-type semiconductor layer 10 or an undoped conductive type. A bandgap of the hetero-barrier alleviation layer 86 is between the bandgap of the optical absorption layer 13 and the bandgap of the n-type semiconductor layer 10. In the present modification, the bandgap of the hetero-barrier alleviation layer 86 is between a bandgap of InGaAs and a bandgap of InP. For example, the hetero-barrier alleviation layer 86 is a Si-doped InGaAsP layer, and for example, a bandgap wavelength thereof is 1.25 µm or 1.40 µm. Alternatively, the hetero-barrier alleviation layer 86 may be a composition graded layer in which the bandgap wavelength continuously varies. For example, a Si-doping concentration of the hetero-barrier alleviation layer 86 is $1\times10^{17}$ cm$^{-3}$ or lower. For example, a thickness of the hetero-barrier alleviation layer 86 is within a range of 0.025 µm to 0.100 µm.

In the present modification, a center position of the optical absorption layer 13 in the thickness direction can be accurately aligned with a center position of the optical waveguiding layer 81 (that is, the optical waveguiding core layer 83 and the p-type semiconductor layer 84) in the thickness direction by adjusting the thickness of the hetero-barrier alleviation layer 86. Hence, even when the optical absorption layer 13 is thinned to increase the operating speed of the light receiving element 2C, a coupling loss can be reduced by matching mode fields of the optical absorption layer 13 and the optical waveguiding layer 81. As a result, both reduction of a coupling loss and high sensitivity can be achieved.

(Third Modification)

Figure 11:
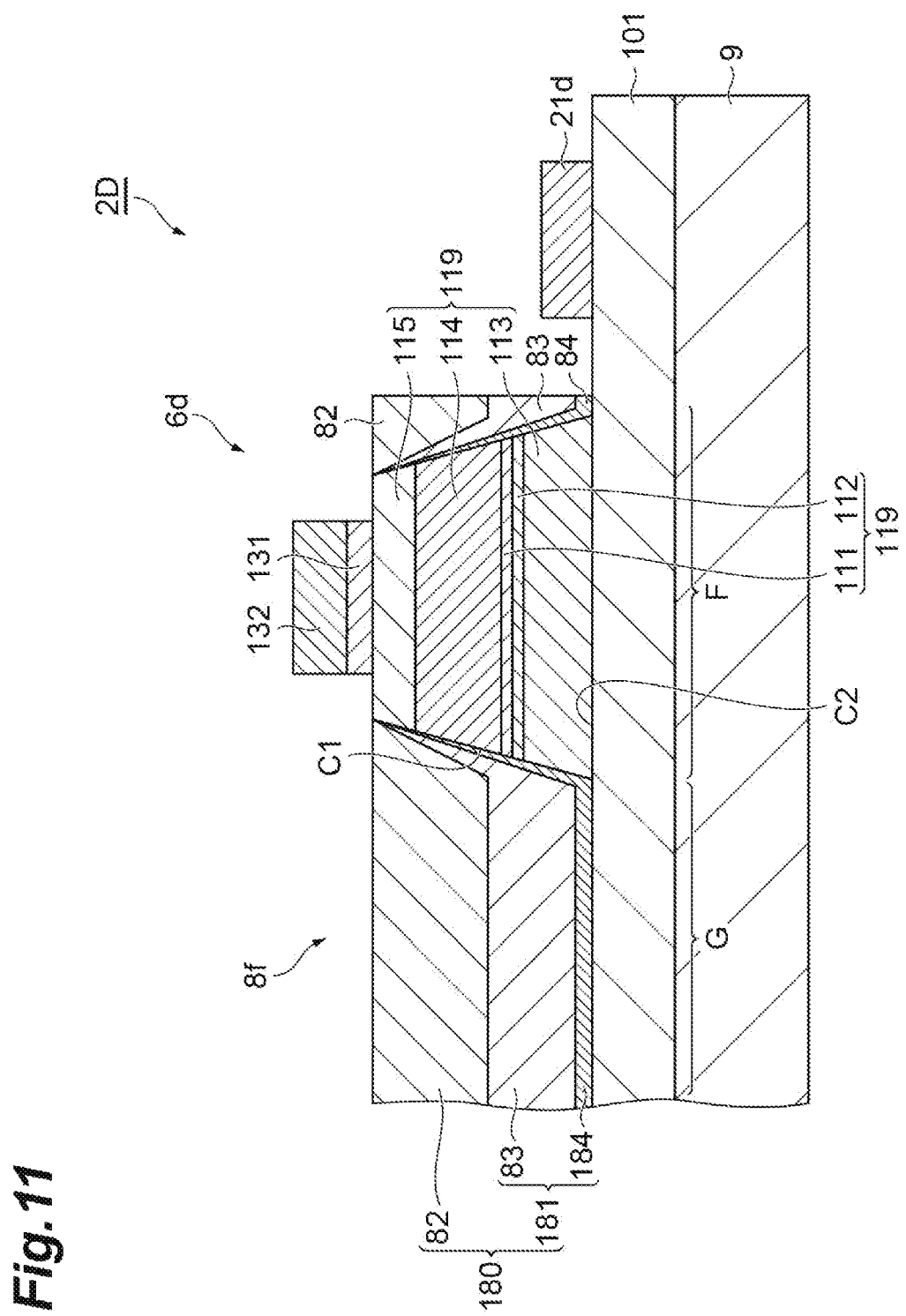
FIG. 11 is a cross-sectional view illustrating a structure of an optical waveguide type light receiving element according to a third modification and illustrates a cross section corresponding to line V-V in FIG. 1.

FIG. 11 is a cross-sectional view illustrating a structure of an optical waveguide type light receiving element 2D according to a third modification of the foregoing embodiment and illustrates a cross section corresponding to line V-V in FIG. 1. The light receiving element 2D has a configuration in which the hole injection type multiplication layer 11 of the foregoing embodiment is changed to an electron injection type multiplication layer 111. Except for the points which will be described below, a configuration of the light receiving element 2D is similar to that of the light receiving element 2A of the foregoing embodiment.

Specifically, the light receiving element portion 6d of the light receiving element 2D has a p-type semiconductor layer 101 and a waveguide type photodiode structure 119. The p-type semiconductor layer 101 is provided on the substrate 9 and is of a high-concentration p-type conductive type (first conductive type). The photodiode structure 119 is provided on a region F (first region) of the p-type semiconductor layer 101. The photodiode structure 119 has an optical absorption layer 113, an n-type semiconductor layer 114, and an n-type contact layer 115. The optical absorption layer 113 is provided on the p-type semiconductor layer 101. The n-type semiconductor layer 114 is provided on the optical absorption layer 113 and is of an n-type conductive type (second conductive type). The n-type contact layer 115 is provided on the n-type semiconductor layer 114. The photodiode structure 119 further has the multiplication layer 111 and a p-type electric field control layer 112. The multiplication layer 111 is provided between the optical absorption layer 113 and the n-type semiconductor layer 114. The p-type electric field control layer 112 is provided between the multiplication layer 111 and the optical absorption layer 113. The p-type semiconductor layer 101 is a first semiconductor layer according to the present embodiment. The p-type electric field control layer 112 is a second semiconductor layer according to the present embodiment. The n-type semiconductor layer 114 is a third semiconductor layer according to the present embodiment.

The p-type semiconductor layer 101 comes into ohmic contact with an p-type ohmic electrode (not illustrated). For example, the p-type semiconductor layer 101 is a Zn-doped InP layer. For example, a Zn-doping concentration of the p-type semiconductor layer 101 is $1\times10^{18}$ cm$^{-3}$ or higher. For example, a thickness of the p-type semiconductor layer 101 is within a range of 1 µm to 2 µm.

The optical absorption layer 113 is of an intrinsic (undoped) conductive type or a p-type conductive type having a lower impurity concentration than the p-type semiconductor layer 101. For example, the optical absorption layer 113 is an undoped InGaAs layer or a low-concentration p-type InGaAs layer of which the Zn-doping concentration is $3\times10^{16}$ cm$^{-3}$ or lower. For example, a thickness of the optical absorption layer 113 is within a range of 0.1 µm to 0.4 µm. For example, the n-type semiconductor layer 114 is a Si-doped InP layer. For example, a Si-doping concentration of the n-type semiconductor layer 114 is $2\times10^{17}$ cm$^{-3}$ or higher. For example, a thickness of the n-type semiconductor layer 114 is within a range of 1 µm to 2.5 µm. For example, the n-type contact layer 115 is a Si-doped InGaAs layer. For example, a Si-doping concentration of the n-type contact layer 115 is $1\times10^{18}$ cm$^{-3}$ or higher. For example, a thickness of the n-type contact layer 115 is within a range of 0.1 µm to 0.3 µm. An n-type ohmic electrode 131 is provided on the n-type contact layer 115.

The multiplication layer 111 is an electron injection type carrier multiplication layer. The multiplication layer 111 is of an intrinsic (undoped) conductive type or a p-type conductive type having a lower impurity concentration than the p-type semiconductor layer 101. In the present embodiment, the impurity concentration of the multiplication layer 111 is lower than an impurity concentration of the n-type semiconductor layer 114 and is lower than an impurity concentration of the p-type electric field control layer 112. For example, the multiplication layer 111 is a Zn-doped InAlAs layer. For example, a Zn-doping concentration of the multiplication layer 111 is $3 \times 10^{16}$ cm$^{-3}$ or lower. For example, a thickness of the multiplication layer 111 is within a range of 0.050 μm to 0.200 μm.

The p-type electric field control layer 112 is provided to lower an electric field of the optical absorption layer 113. The p-type electric field control layer 112 is of a p-type conductive type having a higher impurity concentration than the optical absorption layer 113. A bandgap of the p-type electric field control layer 112 is larger than a bandgap of the optical absorption layer 113 and is equivalent to a bandgap of the p-type semiconductor layer 101 or smaller than the bandgap of the p-type semiconductor layer 101. For example, the p-type electric field control layer 112 is a Zn-doped InP layer or a Zn-doped InAlGaAs layer. For example, a Zn-doping concentration of the p-type electric field control layer 112 is $1 \times 10^{18}$ cm$^{-3}$ or higher. For example, a thickness of the p-type electric field control layer 112 is within a range of 0.025 μm to 0.100 μm.

A composition graded layer may be provided between the optical absorption layer 113 and the p-type electric field control layer 112. The composition graded layer alleviates the hetero-energy barriers (ΔEv and ΔEc) between the optical absorption layer 113 and the p-type electric field control layer 112. The composition graded layer is of an undoped conductive type or a p-type conductive type of which the Zn-doping concentration is $1 \times 10^{17}$ cm$^{-3}$ or lower. An n-type hetero-barrier alleviation layer may be provided between the n-type semiconductor layer 114 and the n-type contact layer 115. For example, the hetero-barrier alleviation layer is constituted of two Si-doped InGaAsP layers of which the doping concentration is $1 \times 10^{18}$ cm$^{-3}$ or higher. For example, bandgap wavelengths of the two Si-doped InGaAsP layers are 1.1 μm and 1.3 μm, respectively.

Also in the present modification, the light receiving element portion 6d further has the semiconductor passivation film 18 (refer to FIG. 3) provided on the photodiode structure 119. A part of the p-type semiconductor layer 101, the optical absorption layer 113, the p-type electric field control layer 112, the multiplication layer 111, the n-type semiconductor layer 114, and the n-type contact layer 115 constitute a stripe mesa structure extending in the optical waveguiding direction (first direction). The stripe mesa structure has a pair of side surfaces extending in the optical waveguiding direction. Also in the present modification, the optical waveguiding direction is the direction B intersecting or orthogonal to the direction A (refer to FIG. 1). The semiconductor passivation film 18 comes into contact with the entire surface of each of the side surfaces of the stripe mesa structure. That is, similar to the side surfaces 19a, the pair of side surfaces of the stripe mesa structure are embedded by the embedment region constituted of the semiconductor passivation film 18.

For example, the n-type ohmic electrode 131 is made of an alloy of AuZn or Pt and the n-type contact layer 115. Further, a wiring 132 is provided on the n-type ohmic electrode 131. The wiring 132 extends in the optical waveguiding direction and electrically connects the n-type ohmic electrode 131 and the electrode pad 21d to each other. For example, the wiring 132 has a laminated structure such as TiW/Au or Ti/Pt/Au.

The optical waveguide portion 8f of the light receiving element 2D is constituted to include the p-type semiconductor layer 101 and an optical waveguide structure 180. The optical waveguide structure 180 is provided on a region G (second region) adjacent to the region F of the p-type semiconductor layer 101 in the optical waveguiding direction (the direction B in FIG. 1). The p-type semiconductor layer 101 is provided from the light receiving element portion 6d to the optical waveguide portion 8f on the substrate 9. The p-type semiconductor layer 101 is in common with the p-type semiconductor layer 101 of the optical waveguide portion 8f. The p-type semiconductor layer 101 functions as a lower cladding layer in the optical waveguide portion 8f. Also in the present modification, the composition, the doping concentration, and the thickness of the p-type semiconductor layer 101 in the optical waveguide portions 8a, 8b, 8c, 8d, 8e, and 8f are the same as those of the p-type semiconductor layer 101 of the light receiving element portion 6d.

The optical waveguide structure 180 has a configuration in which the optical waveguiding layer 81 in the optical waveguide structure 80 is changed to an optical waveguiding layer 181. The optical waveguiding layer 181 has a configuration in which the p-type semiconductor layer 84 in the optical waveguiding layer 81 is changed to an n-type semiconductor layer 184 (fourth semiconductor layer) of an n-type conductive type. The n-type semiconductor layer 184 is provided on the region G of the p-type semiconductor layer 101, and the optical waveguiding core layer 83 is provided on the n-type semiconductor layer 184. That is, similar to the p-type semiconductor layer 84 in the optical waveguiding layer 81, the n-type semiconductor layer 184 is provided between the region G of the p-type semiconductor layer 101 and the optical waveguiding core layer 83.

The n-type semiconductor layer 184 has a larger refractive index than the p-type semiconductor layer 101 and is formed of a material which can be subjected to lattice matching with the p-type semiconductor layer 101. A bandgap of the n-type semiconductor layer 184 is larger than the bandgap of the optical absorption layer 113 and is equivalent to the bandgap of the p-type semiconductor layer 101 or smaller than the bandgap of the p-type semiconductor layer 101. For example, a material of the n-type semiconductor layer 184 is InGaAsP. As an example, a bandgap wavelength of InGaAsP of the n-type semiconductor layer 184 is equivalent to a bandgap wavelength of the optical waveguiding core layer 83. For example, the bandgap wavelength of InGaAsP of the n-type semiconductor layer 184 is 1.05 μm. An impurity concentration of the n-type semiconductor layer 184 is lower than the impurity concentration of the n-type semiconductor layer 114. For example, the n-type semiconductor layer 184 is a low-concentration n-type InGaAsP layer of which the Si-doping concentration is $3 \times 10^{16}$ cm$^{-3}$ or lower. For example, a thickness of a part on the region G in the n-type semiconductor layer 184 is within a range of 0.050 μm to 0.200 μm.

Also in the present embodiment, the n-type semiconductor layer 184 ascends on an end face of the photodiode structure 119 along the first interface C1 and extends between the optical waveguiding core layer 83 and the photodiode structure 119. The n-type semiconductor layer 184 comes into contact with the optical absorption layer 113, the p-type electric field control layer 112, the multiplication layer 111, and the n-type semiconductor layer 114 in the first interface C1. For example, a thickness of a part adjacent to the multiplication layer 111 in the n-type semiconductor layer 184 is within a range of 0.05 μm to 0.5 μm.

In the foregoing embodiment, the hole injection type multiplication layer 11 in which an ionization rate (β) of holes is larger than an ionization rate (α) of electrons has been described as an example. As in the present modification, even in a configuration including the electron injection type multiplication layer 111 in which α is larger than β, effects similar to those of the foregoing embodiment can be exhibited.

Hereinabove, the semiconductor light receiving elements of the present disclosure have been described specifically on the basis of examples, but the semiconductor light receiving elements of the present disclosure are not limited to the foregoing examples and can be changed within a range not departing from the gist thereof. In the foregoing embodiment, a configuration in which the optical waveguide portions 8a, 8b, 8c, 8d, 8e, and 8f and the light receiving element portions 6a, 6b, 6c, and 6d are integrated on the common substrate 9 has been described as an example. A photoelectric conversion circuit including other InP-based electronic devices (for example, hetero junction bipolar transistors), capacitors, and resistors may be further integrated on the substrate 9.

In the embodiment and each of the modifications described above, a case in which the configurations of the present disclosure are applied to an integrated light receiving element used by a coherent wave detection method using quadrature phase shift keying (QPSK) or quadrature amplitude modulation (QAM) has been described. The configurations of the present disclosure may be applied to an optical waveguide type light receiving element having a method of directly detecting an intensity modulation signal such as Non-return to Zero (NRZ) or 4-level pulse amplitude modulation (PAM4).

Figure 12:
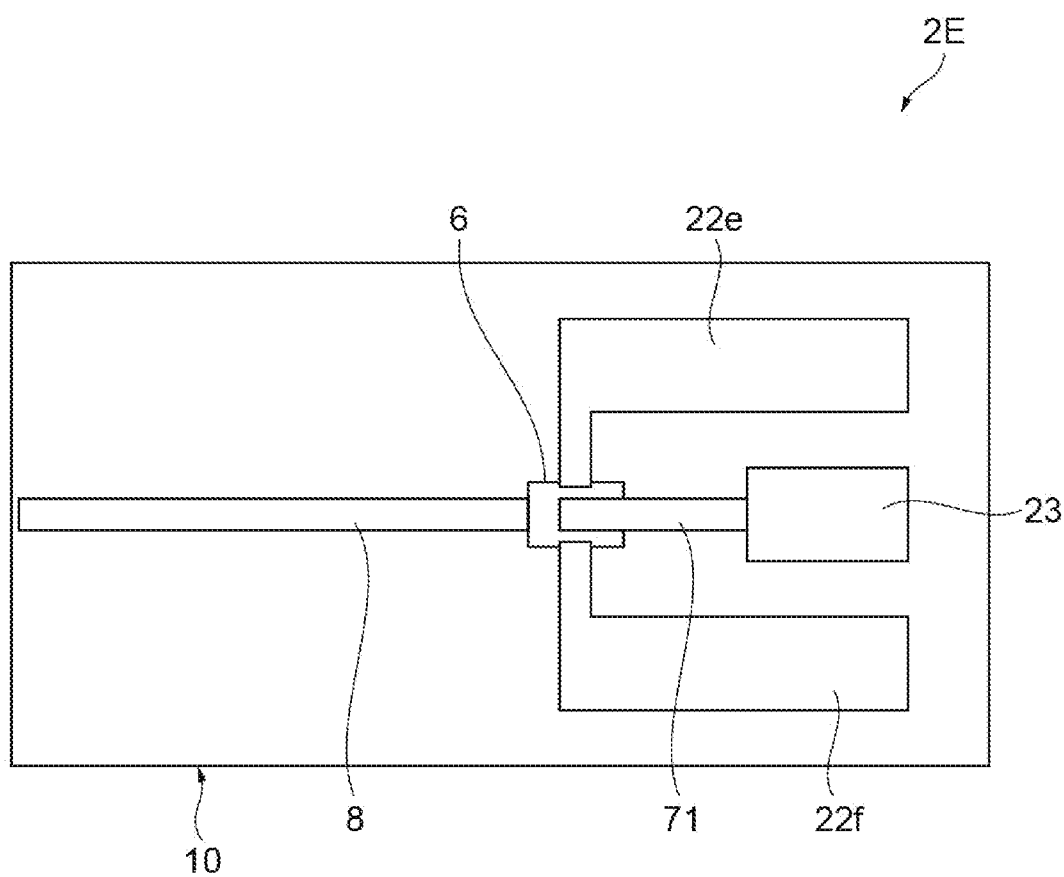
FIG. 12 is a plan view illustrating an example of the optical waveguide type light receiving element.

FIG. 12 is a plan view illustrating an example of such an optical waveguide type light receiving element. An optical waveguide type light receiving element 2E illustrated in FIG. 12 includes the substrate 9 (not illustrated in FIG. 12), the n-type semiconductor layer 10, an optical waveguide portion 8, and a light receiving element portion 6. The substrate 9 is semi-insulating. The n-type semiconductor layer 10 is provided on the substrate 9. The optical waveguide portion 8 and the light receiving element portion 6 are provided on the n-type semiconductor layer 10. The optical waveguide portion 8 has any optical waveguide structure 80 in the embodiment and each of the modifications described above. The light receiving element portion 6 has any of the photodiode structures 19, 19B, and 19C in the embodiment and each of the modifications described above. Moreover, the light receiving element 2E includes the multiplication layer 11 and the n-type electric field control layer 12 described above.

In this example, an electrode pad 23 and a wiring on the p-type ohmic electrode are electrically connected to each other via a wire 71. A bias wiring provided on an n-type ohmic electrode is electrically connected to a pair of electrode pads 22e and 22f provided on both sides of the light receiving element portion 6. The configurations of the present modification can also exhibit effects similar to those of the foregoing embodiment. In this example, the p-type semiconductor layer 101 of FIG. 11 may be provided in place of the n-type semiconductor layer 10, the optical waveguide portion 8 may have the optical waveguide structure 180 of FIG. 11 in place of the optical waveguide structure 80, and the light receiving element portion 6 may have the photodiode structure 119 of FIG. 11 in place of the photodiode structure 19, 19B or 19C.

Second Embodiment

Figure 13:
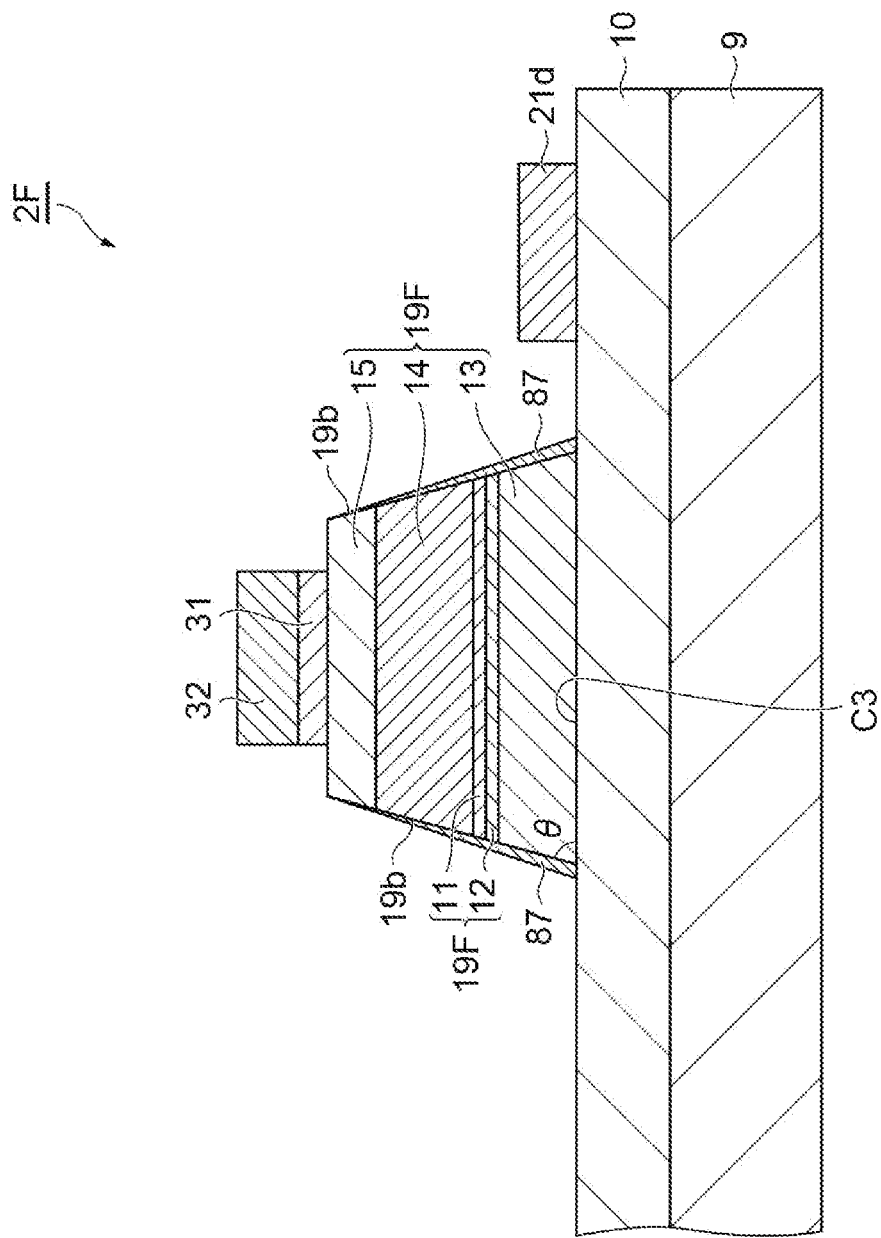
FIG. 13 is a cross-sectional view illustrating a structure of a semiconductor light receiving element according to a second embodiment.

A semiconductor light receiving element according to a second embodiment will be described. FIG. 13 is a cross-sectional view illustrating a structure of a light receiving element 2F according to the second embodiment. In a light receiving device in which the semiconductor light receiving element of the present embodiment is used, a light receiving element portion is provided on the substrate 9 alone independently from the optical waveguide portion. As illustrated in FIG. 13, the light receiving element 2F does not include the optical waveguide structure 80 of the first embodiment. The light receiving element 2F has a configuration in which the photodiode structure 19 of the first embodiment is changed to a photodiode structure 19F. Furthermore, the light receiving element 2F includes a p-type semiconductor layer 87 (seventh semiconductor layer) provided adjacent to the photodiode structure 19F. Except for the points which will be described below, the light receiving element 2F may have a constitution similar to that of the light receiving element 2A of the foregoing embodiment.

Similar to the photodiode structure 19, the photodiode structure 19F has the optical absorption layer 13, the p-type semiconductor layer 14, and the p-type contact layer 15. The optical absorption layer 13 is of an n-type conductive type (first conductive type) and is provided on the n-type semiconductor layer 10. The p-type semiconductor layer 14 is provided on the optical absorption layer 13 and is of a p-type conductive type (second conductive type). The p-type contact layer 15 is provided on the p-type semiconductor layer 14. Moreover, the photodiode structure 19F has the multiplication layer 11 and the n-type electric field control layer 12. The multiplication layer 11 is provided between the optical absorption layer 13 and the p-type semiconductor layer 14. The n-type electric field control layer 12 is provided between the multiplication layer 11 and the optical absorption layer 13. The n-type semiconductor layer 10 is a first semiconductor layer according to the present embodiment. The n-type electric field control layer 12 is a second semiconductor layer according to the present embodiment. The p-type semiconductor layer 14 is a third semiconductor layer according to the present embodiment.

The optical absorption layer 13, the n-type electric field control layer 12, the multiplication layer 11, the p-type semiconductor layer 14, and the p-type contact layer 15 constitute a mesa structure extending in a predetermined direction (which will hereinafter be referred to as "an optical axis direction"). The photodiode structure 19F has end faces 19b for allowing light to be incident thereon. The end faces 19b are surfaces intersecting the optical axis direction in this mesa structure. The end faces 19b is inclined with respect to a direction perpendicular to an upper surface of the n-type semiconductor layer 10, that is, the interface between the n-type semiconductor layer 10 and the optical absorption layer 13. In other words, when an interface between the n-type semiconductor layer 10 and the photodiode structure 19F is a third interface C3, the angle θ formed by the end faces 19b and the third interface C3 is smaller than 90°.

The p-type semiconductor layer 87 is of a p-type conductive type. The p-type semiconductor layer 87 has a larger refractive index than the n-type semiconductor layer 10 and is formed of a material which can be subjected to lattice matching with the n-type semiconductor layer 10. A bandgap of the p-type semiconductor layer 87 is larger than the bandgap of the optical absorption layer 13 and is equivalent to the bandgap of the n-type semiconductor layer 10 or smaller than the bandgap of the n-type semiconductor layer 10. For example, a material of the p-type semiconductor layer 87 is InGaAsP. As an example, a bandgap wavelength of InGaAsP of the p-type semiconductor layer 87 is 1.05 μm. For example, the p-type semiconductor layer 87 is a low-concentration p-type InGaAsP layer of which the Zn-doping concentration is $3\times10^{16}$ cm$^{-3}$ or lower. An impurity concentration of the p-type semiconductor layer 87 is lower than the impurity concentration of the p-type semiconductor layer 14.

The p-type semiconductor layer 87 is provided on the end faces 19b of the photodiode structure 19F and extends along the end faces 19b. The p-type semiconductor layer 87 ascends on the end faces 19b of the photodiode structure 19F and comes into contact with the optical absorption layer 13, the n-type electric field control layer 12, the multiplication layer 11, and the p-type semiconductor layer 14 on the end faces 19b. For example, a thickness of a part adjacent to the multiplication layer 11 in the p-type semiconductor layer 87 is within a range of 0.05 µm to 0.5 µm.

In the first embodiment described above, the light receiving element 2A in which the optical waveguide structure 80 and the photodiode structure 19 are integrated on the common substrate 9 has been described as an example. However, as in the light receiving element 2F according to the present embodiment, even in a configuration including the photodiode structure 19F provided on the substrate 9 alone independently from the optical waveguide structure 80, effects similar to those of the foregoing first embodiment can be exhibited.

Also in the light receiving element 2F, similar to the photodiode structure 19 in the light receiving element 2A described above, the photodiode structure 19F includes the multiplication layer 11 and the n-type electric field control layer 12. The multiplication layer 11 is a carrier multiplication layer provided between the p-type semiconductor layer 14 and the optical absorption layer 13. The multiplication layer 11 is of an n-type conductive type having a lower impurity concentration than the n-type semiconductor layer 10 or is an undoped layer. The n-type electric field control layer 12 is an electric field lowering layer provided between the multiplication layer 11 and the optical absorption layer 13 and is of an n-type conductive type. In this manner, since the photodiode structure 19F includes the multiplication layer 11 and the n-type electric field control layer 12, the photodiode structure 19F having an avalanche multiplication action can be obtained.

Also in the light receiving element 2F, the end faces 19b of the photodiode structure 19F is inclined with respect to a direction perpendicular to the main surface of the substrate 9. Therefore, the end faces of the multiplication layer 11 are also inclined in a similar manner. For this reason, a length of the interface between the n-type electric field control layer 12 and the multiplication layer 11 in the optical waveguiding direction becomes shorter than a length of the interface between the optical absorption layer 13 and the multiplication layer 11 in the same direction. Hence, if the p-type semiconductor layer 87 is not provided, negative electric charges become insufficient in parts in the vicinity of the end faces of the multiplication layer 11 when a reverse bias is applied, and depletion does not proceed compared to other parts in the multiplication layer 11. Therefore, the depletion ranges Ws of parts in the vicinity of the end faces of the multiplication layer 11 become narrow compared to the depletion range We of other parts. As a result, edge breakdown is likely to occur on the end faces 19b. Furthermore, a multiplication current is concentrated in parts in the vicinity of the end faces of the multiplication layer 11, and thus reliability deteriorates.

In the light receiving element 2F of the present embodiment, the p-type semiconductor layer 87 provided on the end faces 19b comes into contact with the multiplication layer 11 and the n-type electric field control layer 12 on the end faces 19b. In this case, at the time of applying a reverse bias, parts in the vicinity of the end faces of the multiplication layer 11 are supplemented with carriers from the p-type semiconductor layer 87. This supplement expands the depletion ranges in the vicinity of the end faces of the multiplication layer 11. Hence, in the multiplication layer 11, the depletion ranges become uniform from a central part to parts in the vicinity of the end faces, and unevenness of the depletion range caused by inclination of the end faces does not occur. That is, according to the light receiving element 2F of the present embodiment, the depletion range of the multiplication layer 11 can be made approximately uniform. Therefore, partial increase in maximum electric field (Emax) in the multiplication layer 11 can be curbed. As a result, edge breakdown can be made unlikely to occur, and deterioration in reliability due to concentration of a multiplication current can be avoided.

In the present embodiment, a configuration in which the first conductive type is an n-type and the second conductive type is a p-type has been described as an example. However, even if the first conductive type is a p-type and the second conductive type is an n-type, effects similar to those of the present embodiment can be exhibited.

Each of the embodiments and each of the modifications described above may be combined together as necessary in accordance with the purpose and the effect. A specific composition of each of the semiconductor layers is not limited to the foregoing examples. In the foregoing examples, the n-type semiconductor layer 10 is provided on the substrate 9. However, when a substrate is an n-type semiconductor substrate, the n-type semiconductor layer 10 may be omitted. In such a case, the n-type semiconductor substrate becomes the first semiconductor layer, and all the relationships between the n-type semiconductor layer 10 and other semiconductor layers in the foregoing description can be read as relationships between the n-type semiconductor substrate and other semiconductor layers.

What is claimed is:

1. A semiconductor light receiving element comprising:
a first semiconductor layer of a first conductive type;
a waveguide type photodiode structure having an end face provided on the first semiconductor layer and including an optical absorption layer being of an intrinsic conductive type or a first conductive type, a second semiconductor layer being of a first conductive type, a multiplication layer being of an intrinsic conductive type or a first conductive type, and a third semiconductor layer being of a second conductive type;
an optical waveguide structure having an end face provided on the first semiconductor layer and including an optical waveguiding core layer and a cladding layer, the end face of the waveguide type photodiode structure facing to the end face of the optical waveguide structure; and
a fourth semiconductor layer being of a second conductive type located between the end face of the waveguide type photodiode structure and the end face of the optical waveguide structure and contacting the multiplication layer at the end face of the waveguide type photodiode structure.

2. The semiconductor light receiving element according to claim 1,
wherein an impurity concentration of the fourth semiconductor layer is lower than an impurity concentration of the third semiconductor layer.

3. The semiconductor light receiving element according to claim 1 further comprising:
   another semiconductor layer provided between the first semiconductor layer and the optical absorption layer,
   wherein the another semiconductor layer is of a first conductive type having a lower impurity concentration than the first semiconductor layer and extends between the first semiconductor layer and the optical waveguiding core layer.

4. The semiconductor light receiving element according to claim 1,
   wherein the waveguide type photodiode structure further includes another semiconductor layer provided between the first semiconductor layer and the optical absorption layer and being of a first conductive type having a lower impurity concentration than the first semiconductor layer.

5. The semiconductor light receiving element according to claim 1, further comprising:
   a semiconductor passivation film provided in the waveguide type photodiode structure,
   wherein in the waveguide type photodiode structure, the optical absorption layer, the second semiconductor layer, the multiplication layer, and the third semiconductor layer constitute a stripe mesa structure extending in an arrangement direction of the waveguide type photodiode structure and the optical waveguide structure,
   wherein the stripe mesa structure has a pair of side surfaces extending in the arrangement direction, and
   wherein the semiconductor passivation film comes into contact with the pair of side surfaces.

6. The semiconductor light receiving element according to claim 1,
   wherein an impurity concentration of the fourth semiconductor layer is $3\times10^{16}$ cm$^{-3}$ or lower.

7. The semiconductor light receiving element according to claim 1,
   wherein a bandgap of the fourth semiconductor layer is larger than a bandgap of the optical absorption layer and is equivalent to a bandgap of the first semiconductor layer or smaller than the bandgap of the first semiconductor layer.

8. The semiconductor light receiving element according to claim 1,
   wherein an angle between the end face of the waveguide type photodiode structure and a plane of the first semiconductor layer is smaller than 90°.

9. The semiconductor light receiving element according to claim 1 further comprising:
   a contact layer of a second conductive type provided on the third semiconductor layer;
   a first ohmic electrode provided on the contact layer; and
   a second ohmic electrode provided on the first semiconductor layer located outside the waveguide type photodiode structure.

10. The semiconductor light receiving element according to claim 1 further comprising:
    a semi-insulating substrate,
    wherein the first semiconductor layer is provided on the semi-insulating substrate.

11. The semiconductor light receiving element according to claim 1,
    wherein a bandgap of the fourth semiconductor layer is equivalent to a bandgap of the optical waveguiding core layer.

12. The semiconductor light receiving element according to claim 1,
    wherein the first semiconductor layer, the multiplication layer, and the third semiconductor layer are InP layers,
    wherein the optical absorption layer is an InGaAs layer,
    wherein the second semiconductor layer is an InP layer or an InAlGaAs layer, and
    wherein the fourth semiconductor layer is an InGaAsP layer.

13. The semiconductor light receiving element according to claim 1,
    wherein a thickness of the fourth semiconductor layer is within a range of 0.050 μm to 0.200 μm.

14. A semiconductor light receiving element comprising:
    an n-type first semiconductor layer;
    a photodiode structure provided on the first semiconductor layer,
       the photodiode structure having an end face, and
       the photodiode structure including an optical absorption layer being of an intrinsic conductive type or n-type, an n-type second semiconductor layer, a multiplication layer being of an intrinsic conductive type or n-type, and a p-type third semiconductor layer; and
    another semiconductor layer being of a p-type and contacting an entire surface of the end face of the photodiode structure, wherein
    a bandgap of the another semiconductor layer is larger than a bandgap of the optical absorption layer and is equivalent to a bandgap of the first semiconductor layer or smaller than the bandgap of the first semiconductor layer.

15. The semiconductor light receiving element according to claim 14,
    wherein an impurity concentration of the another semiconductor layer is lower than an impurity concentration of the third semiconductor layer.

16. The semiconductor light receiving element according to claim 14,
    wherein an impurity concentration of the another semiconductor layer is $3\times10^{16}$ cm$^{-3}$ or lower.

17. A semiconductor light receiving element comprising:
    a first semiconductor layer of a first conductive type;
    a photodiode structure provided on the first semiconductor layer,
       the photodiode structure having an end face, and
       the photodiode structure including an optical absorption layer being of an intrinsic conductive type or a first conductive type, a second semiconductor layer being of a first conductive type, a multiplication layer being of an intrinsic conductive type or a first conductive type, and a third semiconductor layer being of a second conductive type; and
    another semiconductor layer being of a second conductive type and contacting the multiplication layer at the end face of the photodiode structure,
    wherein an impurity concentration of the another semiconductor layer is lower than an impurity concentration of the third semiconductor layer.

18. The semiconductor light receiving element according to claim 17,
    wherein the impurity concentration of the another semiconductor layer is $3\times10^{16}$ cm$^{-3}$ or lower.

19. The semiconductor light receiving element according to claim 17,
    wherein a bandgap of the another semiconductor layer is larger than a bandgap of the optical absorption layer and is equivalent to a bandgap of the first semiconductor layer or smaller than the bandgap of the first semiconductor layer.

\* \* \* \* \*